United States Patent
Hayashi et al.

(10) Patent No.: US 8,582,334 B2
(45) Date of Patent: Nov. 12, 2013

(54) SEMICONDUCTOR DEVICE, POWER CONVERTER AND METHOD FOR CONTROLLING THE POWER CONVERTER

(75) Inventors: Masashi Hayashi, Osaka (JP); Masanori Ogawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/583,825

(22) PCT Filed: Apr. 16, 2012

(86) PCT No.: PCT/JP2012/002628
§ 371 (c)(1),
(2), (4) Date: Sep. 10, 2012

(87) PCT Pub. No.: WO2013/051170
PCT Pub. Date: Apr. 11, 2013

(65) Prior Publication Data
US 2013/0107600 A1    May 2, 2013

(30) Foreign Application Priority Data

Oct. 3, 2011  (JP) .................................. 2011-219103

(51) Int. Cl.
*H02M 7/537* (2006.01)
*H03K 17/82* (2006.01)
(52) U.S. Cl.
USPC ......................................... 363/131; 327/404
(58) Field of Classification Search
USPC .............. 363/97, 98, 131, 132; 327/403, 404, 327/419, 423, 427, 434, 436
See application file for complete search history.

(56) References Cited

U.S. PATENT DOCUMENTS

| 7,872,888 B2* | 1/2011 | Kuzumaki et al. ............... 363/98 |
| 2006/0118818 A1 | 6/2006 | Shimoida et al. |
| 2012/0057386 A1 | 3/2012 | Adachi et al. |
| 2013/0002336 A1* | 1/2013 | Hatsukawa ................... 327/419 |

FOREIGN PATENT DOCUMENTS

| JP | 2002-299625 A | 10/2002 |
| JP | 2006-020405 A | 1/2006 |
| JP | 2007-305836 A | 11/2007 |
| JP | 2008/017237 | 1/2008 |
| WO | 2010/125819 A1 | 11/2010 |

OTHER PUBLICATIONS

Uchida et al., "Novel SiC Power MOSFET with Integrated Unipolar Internal Inverse MOS-Channel Diode", IEEE, IEDMII-602 To IEDM11-605, Conference presented on Dec. 5-7, 2011.

(Continued)

*Primary Examiner* — Matthew Nguyen
(74) *Attorney, Agent, or Firm* — Renner, Otto, Boisselle & Sklar, LLP

(57) ABSTRACT

Disclosed is a semiconductor device which includes: a semiconductor element 200 including a first metal-insulator-semiconductor field-effect transistor 200*a* and a second metal-insulator-semiconductor field-effect transistor 200*b* which is connected in parallel with the first metal-insulator-semiconductor field-effect transistor; and a control section which controls the operation of the semiconductor element. The control section controls the semiconductor element so that in a forward direction mode, current flows in a forward direction through the first and second metal-insulator-semiconductor field-effect transistors but that in a reverse direction mode, current flows in the reverse direction through the first metal-insulator-semiconductor field-effect transistor but does not flow through the second metal-insulator-semiconductor field-effect transistor.

15 Claims, 25 Drawing Sheets

(56) References Cited

OTHER PUBLICATIONS

International Search Report for corresponding International Application No. PCT/JP2012/002628 mailed May 22, 2012.
Form PCT/USA/237 for corresponding International Application No. PCT/JP2012/002628 dated May 22, 2012 and partial English translation.

"Fundamentals and Applications of SiC Elements", edited by Kazuo Arai and Sadashi Yoshida, Ohmsha Ltd., 2003, pp. 206 and concise English translation.
Lendenmann et al., "High-Power SiC Diodes: Characteristics, Reliability and Relation to Material Defects", Materials Science Forum, vols. 389-393 (2002), pp. 1259-1264.

\* cited by examiner (a)

(b)

(a)

(b)

(a)

(b)

(c)

(a)

(b)

(a)

(b)

(a)

(b)

(c)

(a)

(b)

(a)

(b)

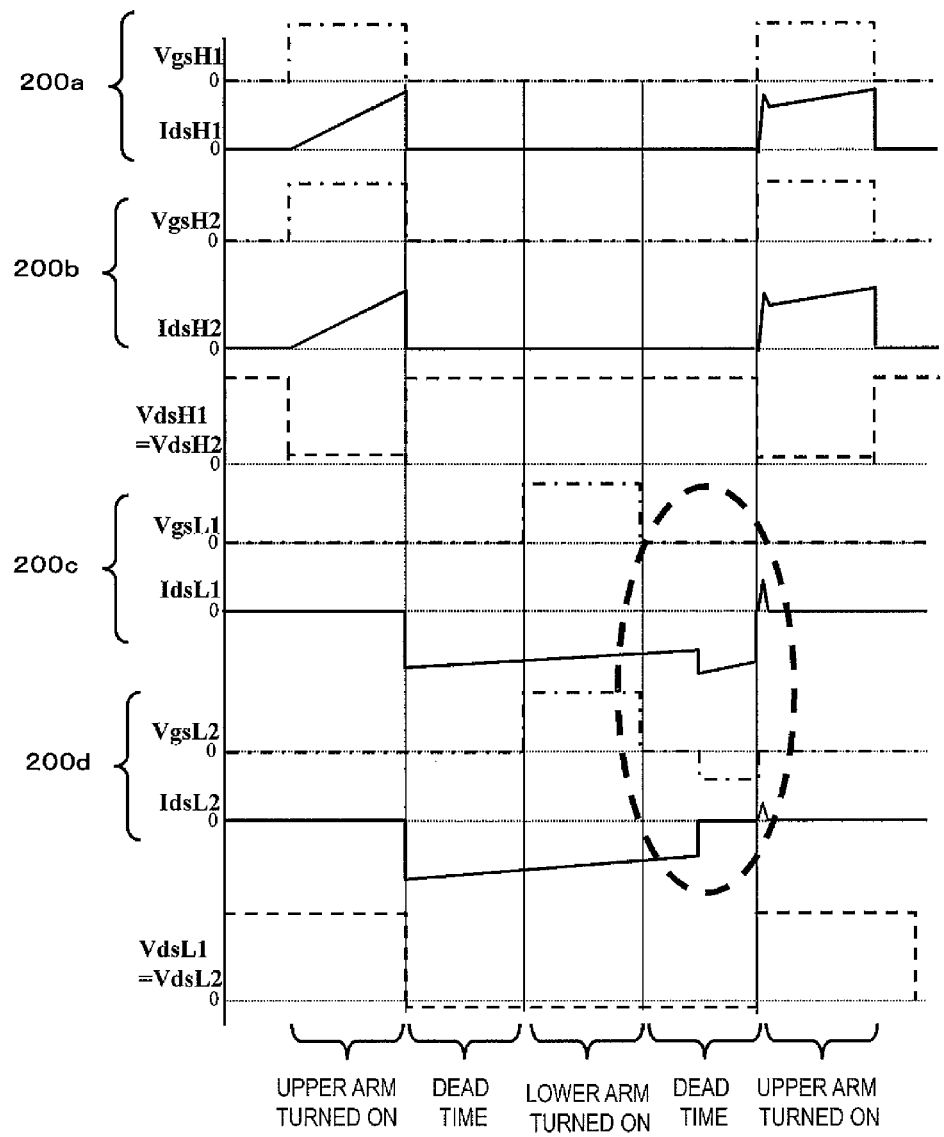

SEMICONDUCTOR DEVICE, POWER CONVERTER AND METHOD FOR CONTROLLING THE POWER CONVERTER

TECHNICAL FIELD

The present invention relates to a semiconductor device and more particularly relates to a silicon carbide semiconductor device (as a power semiconductor device) which can be used in applications that require a high breakdown voltage and a large amount of current. The present invention also relates to a power converter including a silicon carbide semiconductor device and a method for controlling such a power converter.

BACKGROUND ART

Recently, there is a growing demand for a power converter (inverter) that can drive a load operating with alternating current such as a motor as efficiently as possible with its overall size and cost reduced as much as possible. To meet such a demand, a field effect transistor made of silicon carbide has been developed as a switching element for a power converter.

Silicon carbide (SiC) is a high-hardness semiconductor material with a greater bandgap than silicon (Si), and has been used extensively in various kinds of semiconductor devices including power elements, hostile-environment elements, high temperature operating elements, and radio frequency elements. Among other things, the application of SiC to power elements such as semiconductor elements and rectifiers has attracted a lot of attention. This is because a power element that uses SiC can significantly reduce the power loss compared to a Si power element. In addition, by utilizing such properties, SiC power elements can form a smaller semiconductor device than Si power elements.

A metal-insulator-semiconductor field-effect transistor (MISFET) is a typical semiconductor element among various power elements that use SiC. In this description, a MISFET of SiC will sometimes be simply referred to herein as a "SiC-FET". And a metal-oxide-semiconductor field-effect transistor (MOSFET) is one of those MISFETs.

FIG. 17 illustrates an example of a known three-phase power converter that uses SiC-MISFETs as switching elements. As shown in FIG. 17, the three-phase power converter 160 has three legs L1 to L3, which are provided for the three phases, respectively, and each of which has upper and lower arms that are connected together in series. Each of the upper and lower arms includes a switching element 1100 and an external freewheeling diode 1200 which is connected anti-parallel to the switching element 1100. The upper and lower arms ordinarily turn ON and OFF alternately, thereby changing the direction of current flowing through a load 1500. In FIG. 17, the current flowing from the switching element 1100 toward the load 1500 is identified by If. In this case, if the respective switching elements 1100 of the upper and lower arms turn ON simultaneously, then the power supply 2100 will get short-circuited and a huge amount of current will flow and cause a breakdown in the three-phase power converter 1600. Thus, to avoid such a situation, there is an interval in which the switching elements 1100 of both of the upper and lower arms are turned OFF (i.e., a so-called "dead time") when the arms are changed from the upper arm into the lower one, or vice versa. A load on a power converter usually includes an inductive load. That is why even during that dead time, a voltage is also generated between the two terminals of the load in order to make the current that has just stopped flowing through the load start to flow again. As a result, inductive current Ir is generated. And to make that inductive current Ir flow, the freewheeling diode 1200 is connected anti-parallel to the switching element 1100.

As the freewheeling diode 1200, an external diode is generally used. Or if the switching element 1100 is a MISFET, then a pn junction inside of the semiconductor element that works as the MISFET may be used as a "freewheeling diode". Such a pn junction functions as a kind of diode, and therefore is called a "body diode".

It is believed that in a situation where the body diode is used as a freewheeling diode, if return current flows through the pn junction of SiC, then the degradation of crystallinity of a SiC-FET will proceed due to a bipolar operation performed by the body diode (see, for example, Patent Document No. 1 and Non-Patent Documents Nos. 1 and 2). If the degradation of crystallinity of a SiC-FET proceeds, the ON voltage of the body diode could rise. Also, if a body diode is used as a freewheeling diode, a reverse recovery current, which is generated by the reverse recovery of minority carriers of the pn junction, will flow due to the bipolar operation performed by the pn junction diode when the diode in ON state changes into OFF state. And that reverse recovery current causes not only recovery loss but also a decrease in switching rate as well.

Thus, in order to overcome such a problem involved by using a body diode as a freewheeling diode, it was proposed (in Patent Document No. 2, for example) that a return current is made to flow through a freewheeling diode element as an external electronic part by connecting the freewheeling diode element and an SiC-FET in anti-parallel with each other. As a freewheeling diode element for a SiC-FET, a SiC-SBD which would generate almost no reverse recovery current (or recovery loss) is suitably used. However, such a SiC-SBD is expensive and requires an increased number of parts, thus leading to an increase in circuit cost.

Thus, to overcome such a problem, a SiC-MISFET, in which return current is made to flow through the channel of a MISFET, was proposed (in Patent Document No. 3, for example).

CITATION LIST

Patent Literature

Patent Document No. 1: Japanese Laid-Open Patent Publication No. 2008-17237
Patent Document No. 2: Japanese Laid-Open Patent Publication No. 2002-299625
Patent Document No. 3: PCT International Application Publication No. 2010/125819

Non-Patent Literature

Non-Patent Document No. 1: Fundamentals and Applications of SiC elements, edited by Kazuo Arai and Sadashi Yoshida, Ohmsha, Ltd., 2003, p. 206
Non-Patent Document No. 2: Materials Science Forum Vols. 389-393 (2002), pp. 1259-1264

SUMMARY OF INVENTION

Technical Problem

The present inventors analyzed in detail the characteristics of the SiC-MISFET disclosed in Patent Document No. 3. As a result, the present inventors discovered that even if the freewheeling diode had a low turn-on voltage Vf0, the recovery loss still could not be cut down sufficiently in some cases.

The present disclosure provides a non-limiting, exemplary embodiment of a semiconductor device, power converter, and method for controlling such a power converter that can minimize such recovery loss.

Solution to Problem

In order to overcome the problem described above, disclosed in this description is an embodiment of a semiconductor device which includes: a semiconductor element including a first metal-insulator-semiconductor field-effect transistor and a second metal-insulator-semiconductor field-effect transistor which is connected in parallel with the first metal-insulator-semiconductor field-effect transistor; and a control section which controls the operation of the semiconductor element. Each of the first and second metal-insulator-semiconductor field-effect transistors includes: a source electrode; a drain electrode; a gate electrode; and a silicon carbide semiconductor layer which functions as a channel. The direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, the control section is configured to control the semiconductor element so that in a forward direction mode, current flows in the forward direction through the first and second metal-insulator-semiconductor field-effect transistors but that in a reverse direction mode, current flows in the reverse direction through the first metal-insulator-semiconductor field-effect transistor and the amount of reverse current flowing through the second metal-insulator-semiconductor field-effect transistor becomes smaller than that of reverse current flowing through the first metal-insulator-semiconductor field-effect transistor.

Advantageous Effects of Invention

In a semiconductor device according to an embodiment of the present invention, in a power converter that uses SiC-MISFETs where both forward current and reverse current are made to flow through the same channel (i.e., where switching elements and freewheeling diodes are integrated together), recovery loss that would be caused by reverse recovery current to flow through the channel diodes of MISFETs can be reduced.

BRIEF DESCRIPTION OF DRAWINGS

FIG. 1(a) is a cross-sectional view schematically illustrating the structure of a unit cell of a SiC-MISFET with a built-in freewheeling diode and FIG. 1(b) is a circuit symbol of the SiC-MISFET shown in FIG. 1(a).

FIGS. 2(a) and 2(b) are circuit diagrams showing configurations for known power converters which the SiC-MISFET shown in FIG. 1(a) is built in.

FIGS. 3(a) and 3(b) are plan views schematically illustrating a configuration for the SiC-MISFET shown in FIG. 1(a).

FIGS. 5(a) and 5(b) illustrate circuits for evaluating the recovery characteristics in a situation where the SiC-MISFET shown in FIG. 1(a) was used as a diode and in a situation where the diode SiC-MISFET 100 was used as a diode with their gate and source short-circuited with each other, and FIG. 5(c) is a graph showing their recovery characteristics.

FIGS. 8(a) and 8(b) illustrate circuits for evaluating the characteristic of the power converter shown in FIG. 6A and FIG. 8(c) is a graph showing the reverse direction I-V characteristics of the SiC-MISFET 200b shown in FIG. 1(a) alone.

FIGS. 9(a) and 9(b) are graphs showing the recovery characteristics of a semiconductor element, of which the gate was biased under the conditions shown in FIGS. 8(a) and 8(b), respectively.

FIG. 10(a) shows the Vgs dependence of the recovery loss value of a semiconductor element, of which the gate electrode was biased as shown in FIG. 8(b), and FIG. 10(b) shows how the recovery loss ratio changes with the diode's turn-on voltage when Vgs of the SiC-MISFET is changed.

FIGS. 16(a) through 16(c) are plan views illustrating other embodiments of a semiconductor element according to the present invention.

DESCRIPTION OF EMBODIMENTS

Figure 1:
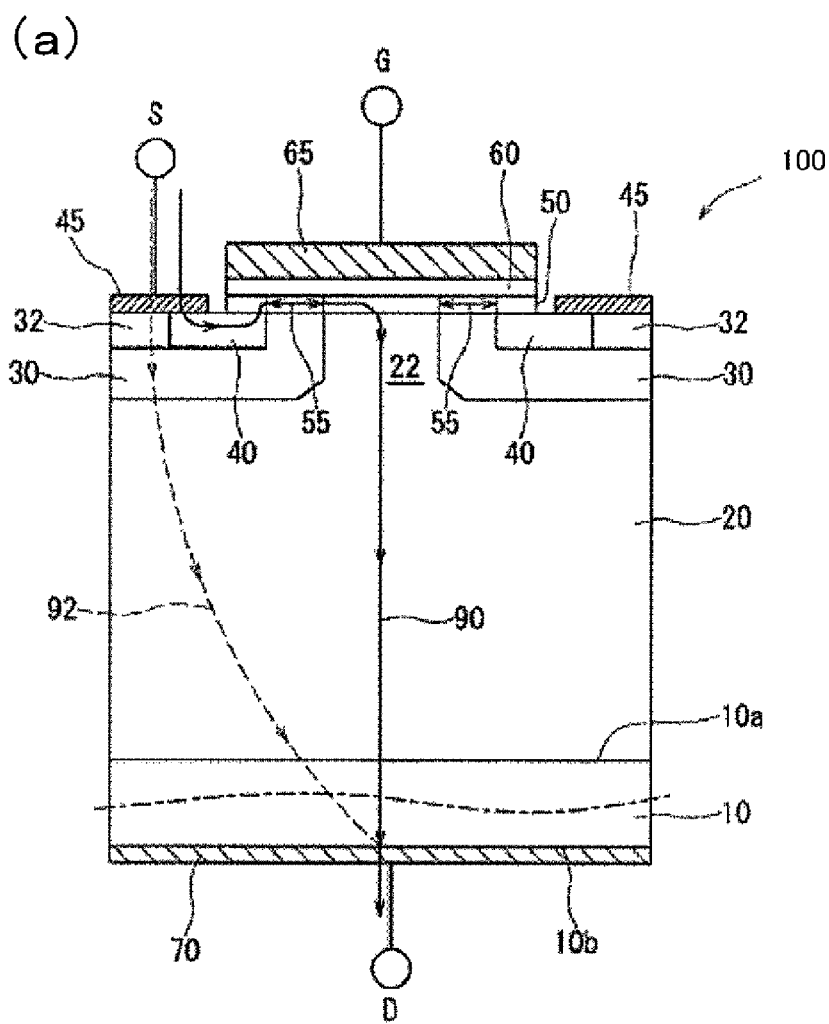
[FIG. 1]
Figure 1:
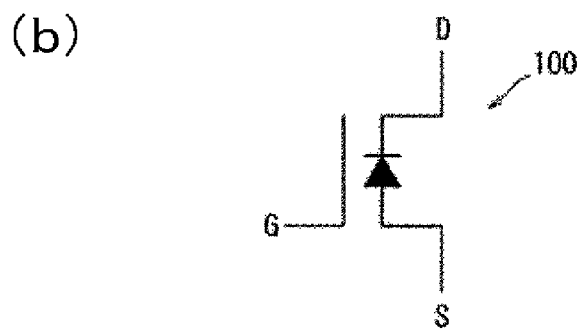
Figure 2:
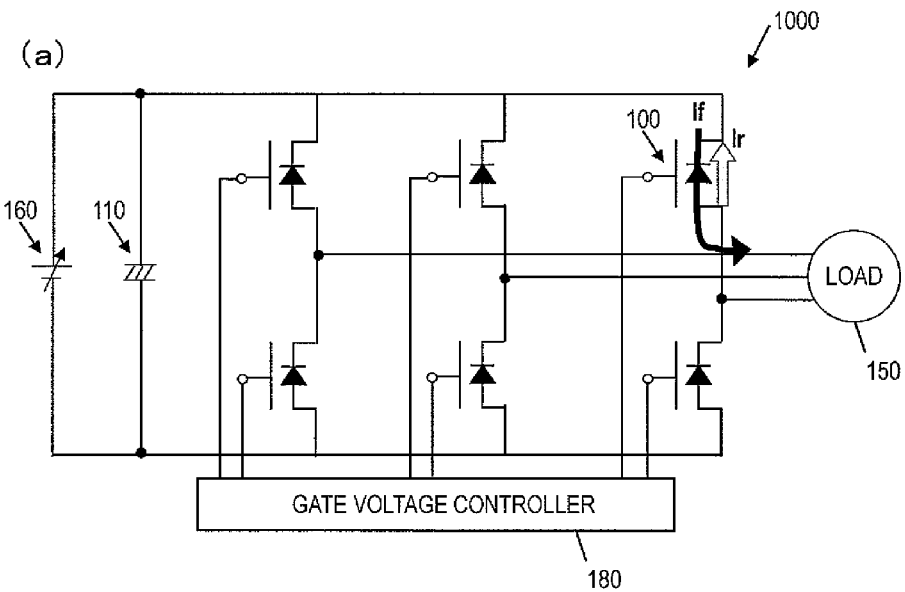
[FIG. 2]
Figure 2:
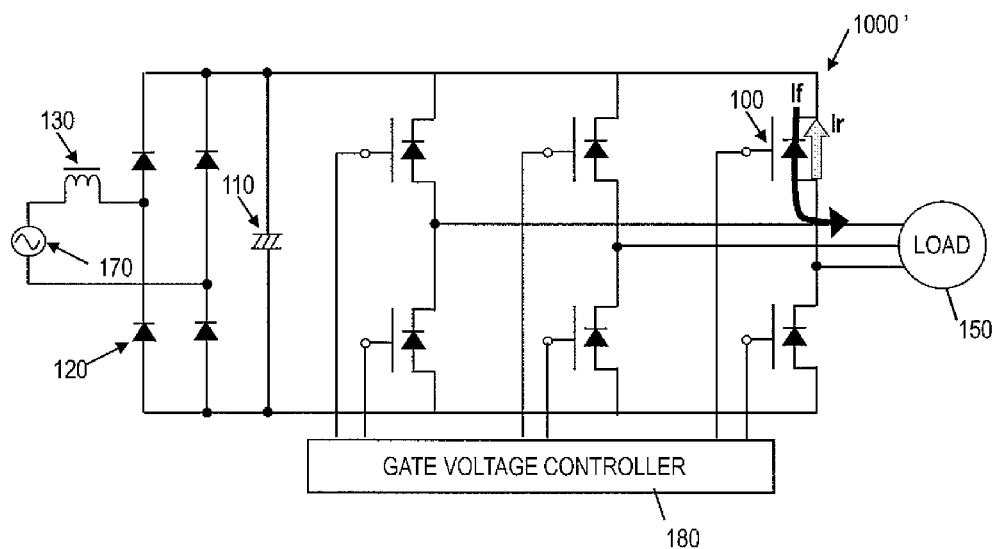

The present invention is based on the finding that was made for the first time by the present inventors. In the following description, that finding will be described first and then various embodiments of the present invention will be described. Although the finding that was made by the present inventors will be described with reference to FIGS. 1 through 5, that is just for convenience sake and the present invention is in no way limited to the specifics illustrated in those drawings.

FIG. 1(a) illustrates a configuration for the SiC-MISFET disclosed in Patent Document No. 3. This SiC-MISFET 100 is made of silicon carbide and has a structure in which an n⁻-drift layer 20 has been stacked on an n⁺-substrate 10 of silicon carbide. A p-body region 30 has been defined in an upper part of the n⁻-drift layer 20. A p-body contact region 32 and an n⁺ source region 40 have been defined in an upper part of the p-body region 30. And a source electrode 45 is arranged on the p-body contact region 32 and the n⁺-source region 40.

A channel layer 50 has been formed to cover the surface of the n-drift layer 20, the p-body region 30 and the n⁺-source region 40. In this case, the channel layer 50 is an epitaxial layer. A gate insulating film 60 and a gate electrode 65 are further arranged on the channel layer 50. A portion of the channel layer 50, which contacts with the upper surface of the p-body region 30, functions as a channel region. On the back surface of the n⁺-substrate 10, arranged is a drain electrode 70.

A body diode has been formed inside of this SiC-MISFET 100. Specifically, the pn junction between the p-body region 30 and the n⁻-drift layer 20 forms the body diode.

Since SiC is a wide bandgap semiconductor, the body diode has a relatively high turn-on voltage Vf0 of around 3 V (e.g., approximately 2.7 V) at room temperature and would cause a lot of loss. Patent Document No. 3 discloses that by optimizing the structures of the p-body region 30 and the channel layer 50, this MISFET functions as a diode that makes current flow in the reverse direction through the channel layer 50 at a turn-on voltage Vf0, the absolute value of which is smaller than that of the body diode (and that will be referred to herein as a "channel diode"). In FIG. 1(a), shown are the path 90 of a current flowing through the channel diode and the path 92 of a current flowing through the body diode.

In the following description, such a SiC-MISFET with a built-in channel diode will be referred to herein as "SiC-DioMOS", of which the circuit symbol is shown in FIG. 1(b). The diode symbol shown in FIG. 1(b) represents a diode that makes current flow through the channel region of the SiC-MISFET 100. Also, G, S and D denote a gate electrode, a source electrode and a drain electrode, respectively. These circuit symbols will be used in the other drawings, too.

FIGS. 2(a) and 2(b) illustrate typical power converters 1000 and 1000', each including a SiC-DioMOS with a built-in channel diode.

The power converters 1000 and 1000' are circuits to drive a load 150 such as a motor, and each include a number of SiC-MISFETs 100 that are SiC-DioMOS. Specifically, in the power converter 1000, an ON-state current (If) and a return current (Ir) flow through the SiC-MISFETs 100, which form an inverter circuit, in a transistor turned ON mode and in a transistor turned-OFF mode, respectively. Three legs are arranged in parallel with respect to a DC power supply 160. One of those three legs is made up of upper and lower arms that are connected in series together. And each of those arms is comprised of SiC-MISFETs 100. Typically, a capacitive element 110 is connected in parallel with protect the DC power supply 160. The gate potential of each of these SiC-MISFETs 100 is controlled by a gate voltage controller (control section) 180. In the power converter 1000' shown in FIG. 2(b), on the other hand, the DC power supply 160 of the power converter 1000 is replaced with an AC power supply 170 and an AC voltage is converted into a DC voltage by a rectifier circuit made up of an inductive element 130 and a rectifying diode element 120.

FIGS. 3(a) and 3(b) are plan views schematically illustrating the SiC-MISFET 100 as a chip. As shown in FIG. 3(a), a girdling (FLR) region 12 and an active region 13 are defined on the principal surface of a SiC substrate 10. FIG. 3(b) illustrates the configuration of the SiC-MISFET 100 on the surface of the chip. A protective insulating film (passivation film) 16 has been deposited on the principal surface of the SiC substrate 10 and a source electrode pad 15 and a gate electrode pad 14, which is smaller than the source electrode pad 15, are exposed through the windows of the protective insulating film 16.

Figure 4:
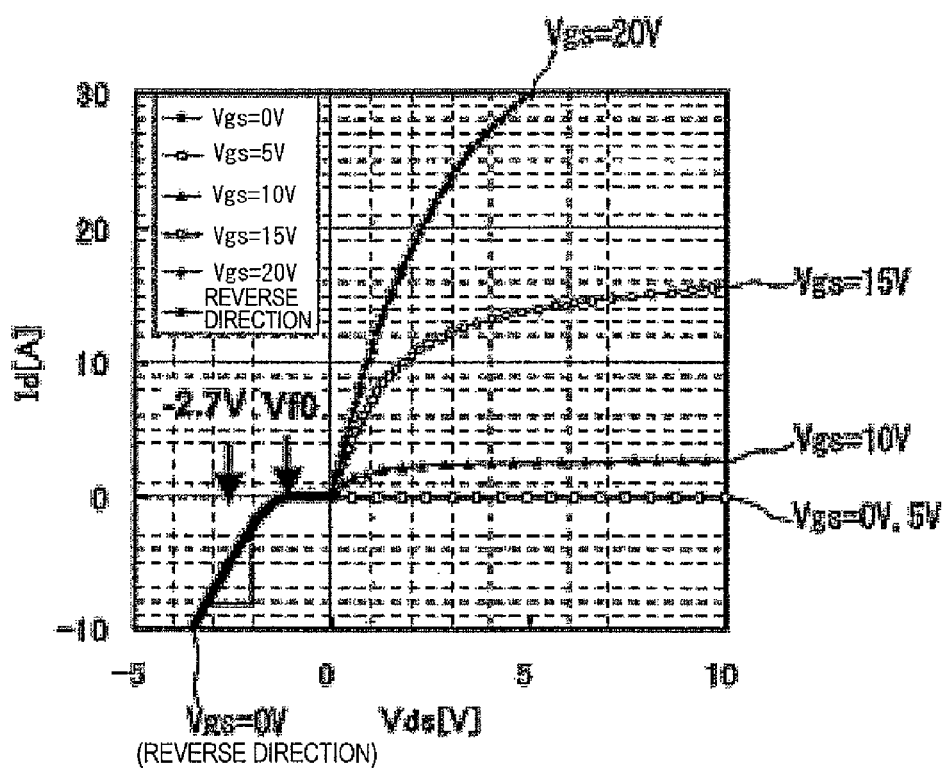
[FIG. 4] A graph showing the I-V characteristics of the SiC-MISFET shown in FIG. 1(a).
Figure 5:
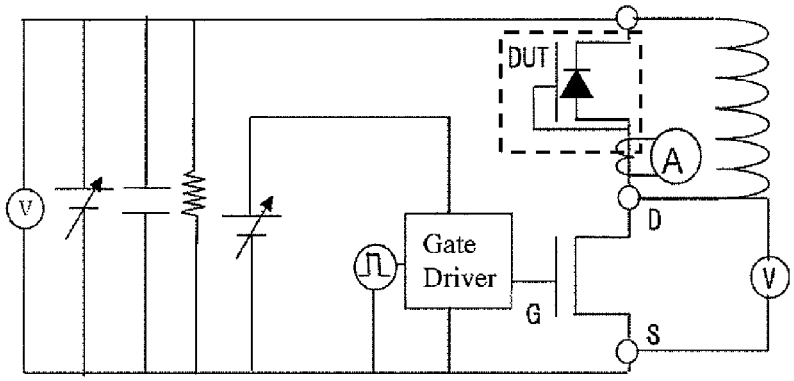
[FIG. 5]
Figure 5:
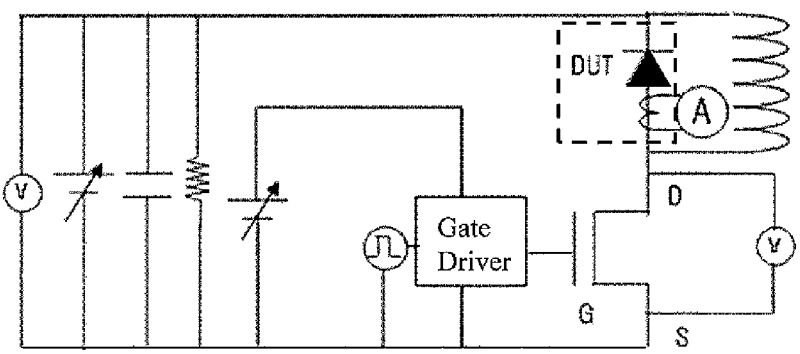
Figure 5:
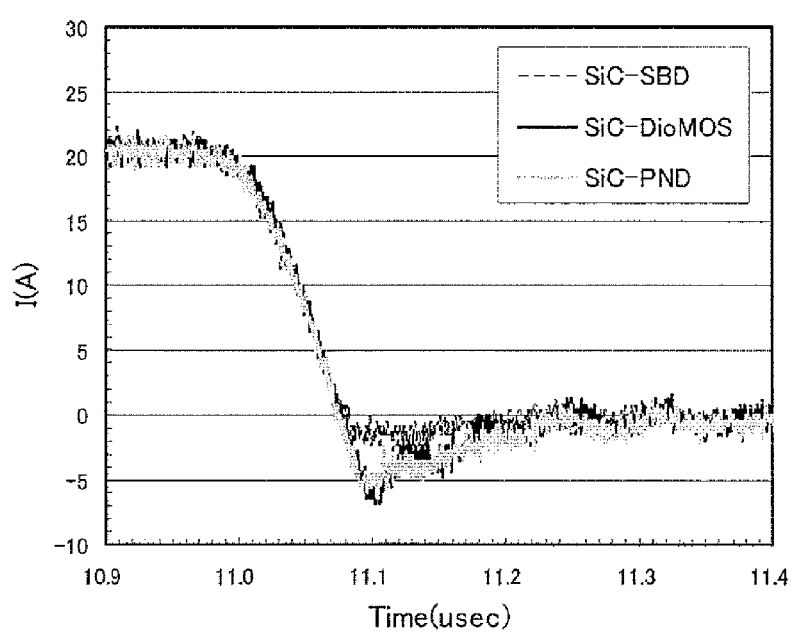

FIG. 4 is a graph showing examples of I-V characteristics of the SiC-MISFET 100 shown in FIG. 1. As shown in FIG. 4, by optimizing the structures of the p-body region and the channel layer, the characteristic of a reverse diode, of which the turn-on voltage Vf0 has a smaller absolute value than that of the body diode (with a Vf0 of approximately 2.7 V), is realized. It will be described in detail later exactly what the turn-on voltage Vf0 is. In this description, the "forward current" is defined herein to be a current flowing between the drain and the source when the drain potential is positively biased with respect to the source of the SiC-MISFET and the "reverse current" is defined herein to be a current flowing between the drain and the source when the drain potential is negatively biased with respect to the source of the SiC-MISFET.

As for such a SiC-MISFET 100 as a SiC-DioMOS, the present inventors analyzed in detail of the recovery characteristic of its freewheeling diode (channel diode).

FIG. 5(a) is a circuit diagram of a circuit for evaluating the recovery characteristic of the channel diode of the SiC-MISFET 100 when its gate and source were short-circuited with each other. On the other hand, FIG. 5(b) is a circuit diagram of a tester circuit which was used to evaluate the recovery characteristic of a retailed SiC-SBD (C3D20060 manufactured by CREE) and that of a SiC-pn diode (PND) of the same chip size as the SiC-MISFET for the purpose of comparison.

The tester circuits were used to measure the current characteristic of the diode as a device under test (DUT) as indicated by the dashed line in FIGS. 5(a) and 5(b). Each tester circuit includes a coil which is connected in parallel with the DUT and a switching element which is connected in series to the DUT. In the circuit shown in FIG. 5(a), if a double pulse voltage is applied to the gate of the switching element, current flows through the path formed by the coil and the switching element, not through the DUT, while the switching element is kept ON with a first pulse voltage. Next, when the switching element turns OFF, the current that has been flowing through the coil by then is going to continue to flow. Thus, counter electromotive force is generated due to self induction at both terminals of the coil. As a result, current flows through the closed circuit formed by the coil and the diode as the DUT.

That is to say, a forward current flows through the DUT. When the switching element turns ON again upon the application of a second pulse voltage, the coil current will flow through the switching element. In this case, the current was measured using a current sensor with a Rogowski coil.

FIG. 5(c) shows the recovery characteristics of the respective diodes that were measured with the circuits shown in FIGS. 5(a) and 5(b), in which the supply voltage Vcc of the DC power supply was set to be 300 V, the inductance L of the inductive load was set to be 100 μH, and the discharge resistance R was set to be 470 kΩ.

As shown in FIG. 5(c), the reverse recovery current of the channel diode of the SiC-MISFET 100 was larger than that (approximately 2 A) of the SiC-SBD and was almost as large as that of the SiC-PND. That is why the channel diode of the SiC-MISFET 100 caused more recovery loss than the SiC-SBD. That is to say, the present inventors discovered that even if the turn-on voltage Vf0 of the channel diode in the I-V characteristic of the channel diode was set to be much lower than that of the body diode, the recovery loss could not always be reduced as a direct result of that.

The present inventors carried out extensive research on how to overcome that problem. As a result, we presumed that the recovery loss could not always be reduced by a known power converter because even if the turn-on voltage of the freewheeling diode was lowered, the source-drain capacitance of the SiC-DioMOS could not be reduced.

Based on these findings, embodiments of the present invention to be described below provide a method for reducing the recovery loss caused by the reverse recovery current of a channel diode.

An embodiment of the present invention is outlined as follows:

A semiconductor device as an embodiment of the present invention includes: a semiconductor element including a first metal-insulator-semiconductor field-effect transistor and a second metal-insulator-semiconductor field-effect transistor which is connected in parallel with the first metal-insulator-semiconductor field-effect transistor; and a control section which controls the operation of the semiconductor element. Each of the first and second metal-insulator-semiconductor field-effect transistors includes: a source electrode; a drain electrode; a gate electrode; and a silicon carbide semiconductor layer which functions as a channel. The direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, the control section is configured to control the semiconductor element so that in a forward direction mode, current flows in the forward direction through the first and second metal-insulator-semiconductor field-effect transistors but that in a reverse direction mode, current flows in the reverse direction through the first metal-insulator-semiconductor field-effect transistor and the amount of reverse current flowing through the second metal-insulator-semiconductor field-effect transistor becomes smaller than that of reverse current flowing through the first metal-insulator-semiconductor field-effect transistor.

The first and second metal-insulator-semiconductor field-effect transistors have the same transistor characteristic.

The potential of the gate electrode with respect to the source electrode is defined to be Vgs, and the control section is configured so that in the reverse direction mode, the second metal-insulator-semiconductor field-effect transistor has a smaller. Vgs than the first metal-insulator-semiconductor field-effect transistor.

The control section is configured so that a difference in Vgs between the first and second metal-insulator-semiconductor field-effect transistors becomes equal to or greater than 2 V.

The control section is configured so that Vgs of the first and second metal-insulator-semiconductor field-effect transistors both become negative values.

The control section is configured so that a difference in Vgs between the first and second metal-insulator-semiconductor field-effect transistors becomes equal to or greater than 5 V.

The control section is configured to set Vgs of the first and second metal-insulator-semiconductor field-effect transistors to be equal to 0 V and less than 0 V, respectively, in the reverse direction mode.

The first and second metal-insulator-semiconductor field-effect transistors are arranged on mutually different substrates.

The first and second metal-insulator-semiconductor field-effect transistors are arranged on the same substrate.

The semiconductor device further includes a terminal structure that surrounds the first and second metal-insulator-semiconductor field-effect transistors.

The semiconductor element further includes a diode which is connected in series to the second metal-insulator-semiconductor field-effect transistor, and the first metal-insulator-semiconductor field-effect transistor is connected in parallel with the second metal-insulator-semiconductor field-effect transistor and the diode that are connected in series together.

A semiconductor device as another embodiment of the present invention includes: a semiconductor element including a metal-insulator-semiconductor field-effect transistor which is made of a silicon carbide semiconductor and an insulated gate bipolar transistor which is connected in parallel with the metal-insulator-semiconductor field-effect transistor and which is made of silicon; and a control section which controls the operation of the semiconductor element. The metal-insulator-semiconductor field-effect transistor includes a source electrode, a drain electrode, a gate electrode and a silicon carbide semiconductor layer that functions as a channel. The insulated gate bipolar transistor includes a gate electrode, a collector electrode and an emitter electrode. In the metal-insulator-semiconductor field-effect transistor, the direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, and in the insulated gate bipolar transistor, the direction of current flowing from the collector electrode toward the emitter electrode is defined to be a forward direction and the direction of current flowing from the emitter electrode toward the collector electrode is defined to be a reverse direction, the control section is configured to control the semiconductor element so that in a forward direction mode, current flows in the forward direction through the metal-insulator-semiconductor field-effect transistor and the insulated gate bipolar transistor but that in a reverse direction mode, and current flows in the reverse direction through the metal-insulator-semiconductor field-effect transistor.

A power converter as an embodiment of the present invention includes a plurality of legs, each of which includes an upper arm and a lower arm that are each comprised of semiconductor devices according to any of the embodiments described above.

Current flows through a smaller number of first and second metal-insulator-semiconductor field-effect transistors in the reverse direction mode than in the forward direction mode.

A semiconductor element controlling method as an embodiment of the present invention is a method for controlling a semiconductor element including a first metal-insulator-semiconductor field-effect transistor and a second metal-insulator-semiconductor field-effect transistor which is connected in parallel with the first metal-insulator-semiconductor field-effect transistor. Each of the first and second metal-insulator-semiconductor field-effect transistors includes a source electrode, a drain electrode, a gate electrode, and a silicon carbide semiconductor layer which functions as a channel. The direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, and the semiconductor element is controlled so that in a forward direction mode, current flows in the forward direction through the first and second metal-insulator-semiconductor field-effect transistors but that in a reverse direction mode, current flows in the reverse direction through the first metal-insulator-semiconductor field-effect transistor and the amount of reverse current flowing through the second metal-insulator-semiconductor field-effect transistor becomes smaller than that of reverse current flowing through the first metal-insulator-semiconductor field-effect transistor.

A power converter controlling method as an embodiment of the present invention is a method for controlling the power converter described above. The semiconductor elements of the upper and lower arms are driven so as to alternately turn ON with a dead time, in which the semiconductor elements of the upper and lower arms are both turned OFF, interposed, and either the semiconductor element of the upper arm or the second metal-insulator-semiconductor field-effect transistor of the semiconductor element of the lower arm has its gate voltage set to be a negative voltage during at least a part of the dead time.

(Embodiment 1)

Hereinafter, a first embodiment of a semiconductor device, power converter and its control method according to the present invention will be described. Any pair of components shown in multiple drawings to be referred to in the following description but having substantially the same function will be identified herein by the same reference numeral for the sake of simplicity.

Figure 6A:
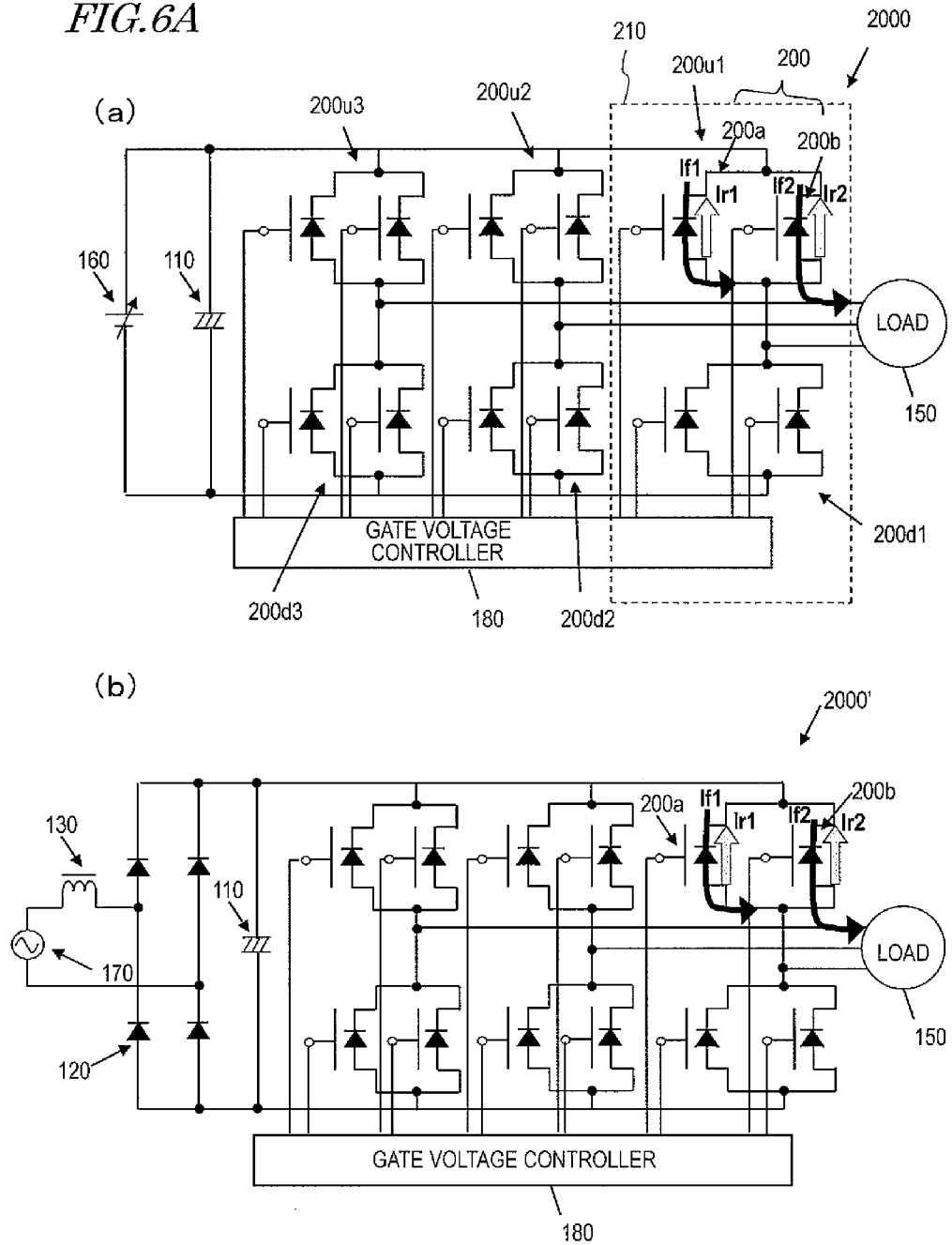
[FIG. 6A] (a) and (b) of FIG. 6A are circuit diagrams illustrating embodiments of a power converter according to the present invention.

Portion (a) of FIG. 6A illustrates a configuration for a power converter 2000 as a first embodiment of the present invention. Just like the circuit shown in FIG. 2, the power converter 2000 is a circuit for driving an inductive load 150 such as a motor, converts a DC power supply 160 into an AC power and supplies that power to the load 150. The power converter 2000 typically includes an inverter circuit comprised of multiple semiconductor elements 100 and a gate voltage controller 180. Although the power converter 2000 usually does not include any DC power supply 160, the DC power supply 160 is also shown alongside in portion (a) of FIG. 6A in order to illustrate the configuration of the circuit. Optionally, the power converter 2000 may further include a capacitive element 110 which is connected in parallel with the DC power supply 160 in order to protect the DC power supply 160. Alternatively, as shown in portion (b) of FIG. 6A, the DC power supply 160 may be replaced with an AC power supply 170 as a power supply for supplying power to the load 150. In that case, it is recommended that the AC voltage is converted into a DC voltage by a rectifier circuit that is made up of an inductive element 130 and a rectifying diode element 120.

As shown in portion (a) of FIG. 6A, the power converter 2000 includes a plurality of legs 210, which are connected in parallel with the DC power supply 160 in order to apply a multi-phase AC voltage to the load 150. In this embodiment, in order to apply a three-phase AC voltage to the load 150, the power converter 2000 has three legs 210. Specifically, one of the three legs 210 is formed by upper and lower arms 200$u$1 and 200$d$1, another leg 210 by upper and lower arms 200$u$2 and 200$d$2, and the other 210 by upper and lower arms 200$u$3 and 200$d$3. In each of these legs 210, the upper and lower arms are connected together in series and an AC power is supplied from a point of connection between the upper and lower arms to the load 150 in a predetermined phase.

In the power converter 2000 of this embodiment, each of the upper and lower arms of each leg is implemented as a semiconductor element 200 in which SiC-MISFETs 200$a$ and 200$b$ are connected together in parallel. In this description, the "semiconductor element" may be any element including two SiC-MISFETs that are connected in parallel with each other on the circuit diagram. For example, the semiconductor element 200 may be either a single electronic part or a combination of multiple electronic parts. That is to say, each leg is formed by connecting in series together two semiconductor elements 200, in each of which SiC-MISFETs 200$a$ and 200$b$ are connected in parallel with each other. In this case, when the SiC-MISFETs 200$a$ and 200$b$ are connected together in parallel, the respective drain electrodes (i.e., terminals) of the SiC-MISFETs 200$a$ and 200$b$ are electrically connected together, so are their source electrodes (i.e., their terminals), but their gate electrodes (i.e., their terminals) are connected to the gate voltage controller 180 separately from each other. That is to say, gate voltages Vgs can be applied to the respective gate electrodes (i.e., their terminals) of the SiC-MISFETs 200$a$ and 200$b$ independently of each other. By controlling the voltages applied to the gate electrodes of the SiC-MISFETs 200$a$ and 200$b$ and their timings of application, the gate voltage controller 180 controls the operation of the semiconductor element 200.

For example, in the SiC-MISFETs 200$a$ and 200$b$, a predetermined potential difference Vds is applied between the source and drain electrodes so that the source electrode has a higher potential than the drain electrode and a gate voltage Vgs, which is equal to or higher than a threshold value Vth, is applied to the gate electrode, thereby turning the SiC-MISFETs 200$a$ and 200$b$ ON. As a result, as shown in portion (a) of FIG. 6A, currents If1 and If2 flow from the SiC-MISFETs 200$a$ and 200$b$ to the load 150.

Each of the SiC-MISFETs 200$a$ and 200$b$ is a SiC-DioMOS with a built-in channel diode. That is to say, if each of these SiC-MISFETs 200$a$ and 200$b$ is reverse-biased (i.e., if the potential of its source electrode is increased to more than that of its drain electrode), currents Ir1 and Ir2 will flow in the reverse direction through the channel layer 50 and the MISFET functions as a freewheeling diode. The source-drain potential difference Vds at which the currents Ir1 and Ir2 start to flow will be referred to herein as the turn-on voltage Vf0 of a reverse current. Vf0 is ordinarily a negative value. As shown in FIG. 1($a$), the channel layer 50 is an epitaxial layer of silicon carbide. Each of the SiC-MISFETs 200$a$ and 200$b$ has a structure in which a number of unit cells, each having the structure shown in FIG. 1($a$), are connected together in parallel, which means that the respective source electrodes of those unit cells are connected together, so are their drain electrodes and their gate electrodes.

In this embodiment, the two SiC-MISFETs (which may be the SiC-MISFETs 200a and 200b, for example) that form each of the upper and lower arms of each leg have the same transistor characteristics, which at least include the threshold value Vth and the reverse current turn-on voltage Vf0. That is to say, the threshold values Vth of the two SiC-MISFETs are equal to each other, so are their reverse current turn-on voltages Vf0. In this description, if their threshold values Vth are equal to each other, it means that their threshold values Vth are quite the same or their difference falls within the range of ±10%. The same can be said about the reverse current turn-on voltage Vf0.

Figure 7:
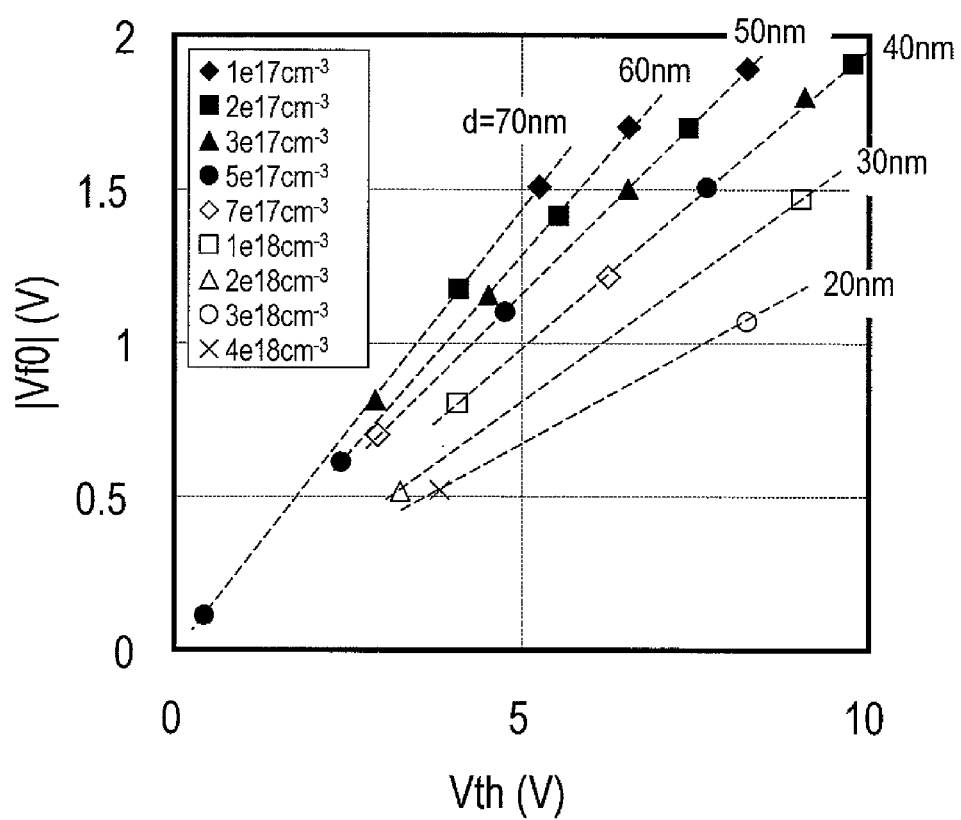
[FIG. 7] A graph showing exemplary correlations between the threshold voltage of the SiC-MISFET shown in FIG. 1(a) and the absolute value of the turn-on voltage of the channel diode.

The SiC-MISFETs for use in this embodiment can have their reverse current turn-on voltage Vf0 adjusted based on the threshold value Vth. FIG. 7 shows exemplary correlations between the threshold voltage Vth and the absolute value |Vf0| of the reverse current turn-on voltage Vf0 in the SiC-MISFETs 200a and 200b. In FIG. 7, the abscissa represents the threshold voltage Vth and the ordinate represents the absolute value |Vf0| of the reverse current turn-on voltage Vf0. When simulations were carried out to obtain the results shown in FIG. 7, the concentration of the p-body region 30 was fixed at $1 \times 10^{19}$ cm$^{-3}$ and the thickness of the gate insulating film 60 was fixed at 70 nm. The ranges of the other parameters are as follows:

thickness of the channel layer 50: 20 to 70 nm
concentration of the channel layer 50: $1 \times 10^{17}$ cm$^{-3}$ to $4 \times 10^{18}$ cm$^{-3}$ It can be seen from FIG. 7 that by decreasing the thickness of the channel layer 50 and increasing its dopant concentration, Vth can be increased with |Vf0| kept constant. More specifically, in the SiC-MISFET for use in this embodiment, the gate voltage (Vth) that turns the transistor ON can be adjusted without changing the voltage (Vf0) at which the SiC-MISFET starts to function as a channel diode. Alternatively, in the SiC-MISFET for use in this embodiment, the voltage (Vf0) at which the SiC-MISFET starts to function as a channel diode can be adjusted without changing the gate voltage (Vth) that turns the transistor ON. That is why by appropriately setting the dopant concentration and thickness of the channel layer 50, Vth and |Vf0| can be controlled independently of each other.

As an example, it will be described with reference to FIG. 7 how to set the thickness and dopant concentration of the channel layer 50 in a situation where Vth and |Vf0| are controlled to be 5 V and 1 V, respectively.

First of all, find the channel layer's thickness corresponding to a correlation line that passes the intersection between Vth=5 V and |Vf0|=1 V, and it can be seen that the thickness is approximately 40 nm in FIG. 7. That is why the thickness of the channel layer is set to be 40 nm. Next, at that channel layer's thickness, the dopant concentration needs to be set to satisfy Vth=5 V. In this case, the dopant concentration may be set to be approximately $8.5 \times 10^{17}$ cm$^{-3}$, which is the intermediate point between the two concentrations $7 \times 10^{17}$ cm$^{-3}$ and $1 \times 10^{18}$ cm$^{-3}$ where data is available.

By adjusting the thickness and dopant concentration of the channel layer 50 in this manner for the SiC-MISFETs 200a and 200B, the absolute value of the turn-on voltage of the channel diode can be set to be smaller than that of the turn-on voltage of the body diode. Consequently, the SiC-MISFETs 200a and 200b are SiC-DioMOS that function as freewheeling diodes as the currents Ir1 and Ir2 flow in the reverse direction through the channel layer 50 of silicon carbide. More specific structure and manufacturing process of the SiC-MISFETs 200a and 200b are disclosed in Patent Document No. 3, for example.

According to this embodiment, the SiC-MISFETs 200a and 200b are packaged independently of each other. FIGS. 3(a) and 3(b) are plan views illustrating the packaged SiC-MISFET 200a or 200b. A girdling (FLR) region 12 and an active region 13 are defined on the principal surface of a SiC substrate 10. A plurality of unit cells, each having the configuration shown in FIG. 1(a), are arranged in the active region 13. FIG. 3(b) illustrates the configuration of the SiC-MISFET 100 on the surface of the chip. A protective insulating film 16 has been deposited on the principal surface of the SiC substrate 10 and a source electrode pad 15 and a gate electrode pad 14, which is smaller than the source electrode pad 15, are exposed through the windows of the protective insulating film 16. Although girdling is adopted as the terminal structure in this example, a mesa structure or a junction terminal end (JTE) may also be used.

As the SiC-MISFETs 200a and 200b are packaged separately from each other, these SiC-MISFETs 200a and 200b have mutually independent gate electrodes (or terminals). The SiC-MISFETs 200a and 200b may either have quite the same specifications or use different rated currents or other specifications according to the configuration of the load 150. The SiC-MISFETs 200a and 200b that form each of the upper and lower arms of each leg are supplied with Vgs independently of each other by the gate voltage controller 180.

In the power converter 2000 of this embodiment, each arm of each leg is comprised of two SiC-MISFETs that are connected in parallel with each other. In the forward direction mode, both of those two SiC-MISFETs are operated. In the reverse direction mode, on the other hand, one of the two SiC-MISFETs is made to operate as a freewheeling diode but the other SiC-MISFET is kept from operating as a freewheeling diode, thereby reducing the parasitic capacitance and the recovery loss in the reverse direction mode. For that purpose, the gate voltage controller 180 of the power converter 2000 controls the semiconductor element 200 so that forward current flows through both of the SiC-MISFETs 200a and 200b in the forward direction mode and that a reverse current flows through the SiC-MISFET 200a but is prevented from flowing through the SiC-MISFET 200b in the reverse direction mode. Specifically, by setting Vgs of the SiC-MISFET 200b to be less than 0 V in the reverse direction mode, the SiC-MISFET 200b is prevented from functioning as a freewheeling diode.

Figure 8:
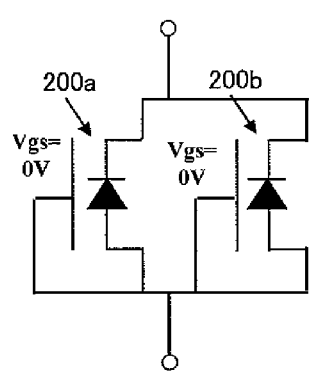
[FIG. 8]
Figure 8:
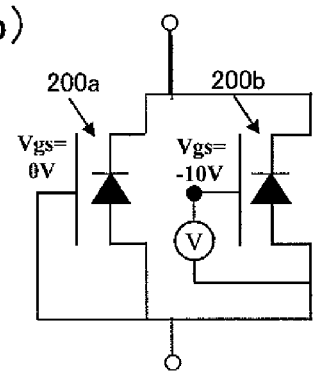
Figure 8:
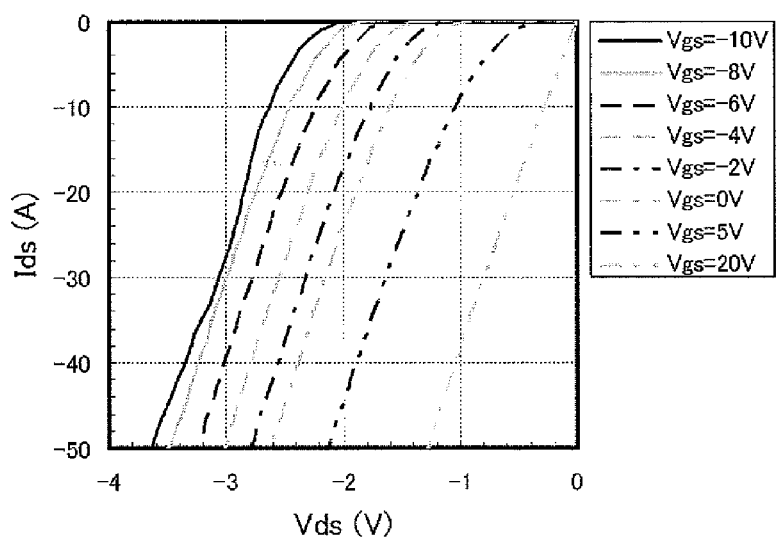

Hereinafter, it will be described in detail how this power converter 2000 operates. First of all, the recovery characteristic of the semiconductor element 200 operating as a diode was evaluated with the tester circuit shown in FIG. 5(a). FIGS. 8(a) and 8(b) illustrate how the gate terminals of the semiconductor element 200 are connected in the DUT portion as indicated by the dashed line in the tester circuit shown in FIG. 5(a). The semiconductor element 200 subjected to that test was a parallel connection of the SiC-MISFETs 200a and 200b that had been fabricated under the same condition and then packaged separately from each other. FIG. 8(a) illustrates how to connect the gate terminals when its gate and source were short-circuited with each other (i.e., when Vgs was set to be 0 V) in both of the SiC-MISFETs 200a and 200b. On the other hand, FIG. 8(b) illustrates a circuit configuration in which a DC power supply is connected to the gate terminal in order to set Vgs of the SiC-MISFETs 200a and 200b to be 0 V and a negative value, respectively. In this example, various Vgs falling within the range of −2 V through −10V were applied at a step of 2 V. In the other respects, however, the recovery characteristic tester circuit and condition adopted were just as already described with reference to FIG. 5.

FIG. 8(c) shows the reverse direction I-V characteristic of the SiC-MISFET 200b that was subjected to the evaluation. It can be seen that by setting Vgs to be a negative value, the absolute value of the turn-on voltage Vf0 of the reverse direction diode increased. For example, the turn-on voltage Vf0 defined by a drain-source voltage Vds that produced a reverse current Ids=−20 A was approximately −1.8 V when Vgs=0 V but was approximately −2.9 V when Vgs=−10 V. That is to say, the absolute value increased by as much as more than 1 V.

If Vgs is negative, the SiC-MISFET for use in this embodiment is in OFF state. That is why even though the SiC-MISFET for use in this embodiment is still in OFF state, the turn-on voltage Vf0 of the reverse direction diode can be adjusted by changing Vgs.

Also, if Vds is constant in the SiC-MISFET for use in this embodiment, then the current (Ids) to flow through the reverse direction diode can be adjusted by changing Vgs. For example, if Vgs is −2 V, the amount of current (−16 A) to flow through the reverse direction diode then becomes approximately 65% of the amount of current (−24 A) to flow when Vgs is 0 V.

Figure 9:
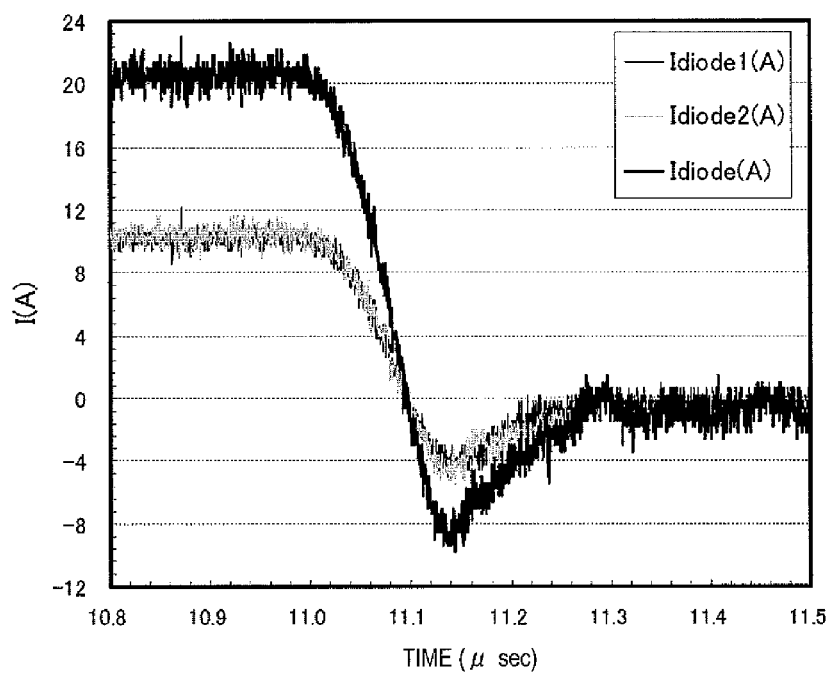
[FIG. 9]
Figure 9:
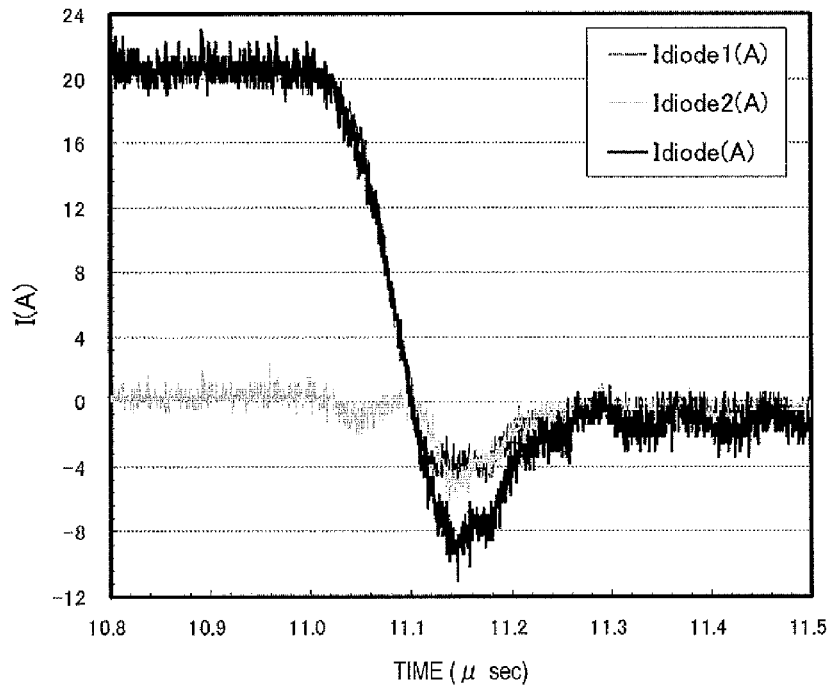

FIG. 9(a) shows the recovery characteristic that was evaluated when Vgs of both of the SiC-MISFETs 200a and 200b were set to be 0 V using the DUT of the tester circuit shown in FIG. 5(a) as the semiconductor element 200 shown in FIG. 8(a). On the other hand, FIG. 9(b) shows the recovery characteristic that was evaluated when Vgs of the SiC-MISFETs 200a and 200b were set to be 0 V and −10V, respectively, using the DUT of the tester circuit shown in FIG. 5(a) as the semiconductor element 200 shown in FIG. 8(b). The total amount of current was obtained by measuring the amounts of current flowing through the SiC-MISFETs 200a and 200b with a current sensor including a Rogowski coil and then adding together those amounts of current measured.

In FIG. 9(a), the reverse currents Ids of the SiC-MISFETs 200a and 200b and the total amount of current (=200a+200b) are identified by Idiode1, Idiode2 and Idiode, respectively. Since the SiC-MISFETs 200a and 200b have substantially the same diode characteristic, both Idiode1 and Idiode2 were approximately −10 A before the recovery operation (i.e., before the switching MISFETs were turned ON). Right after the recovery operation was performed, a reverse current of approximately −4 A flowed through the SiC-MISFETs 200a and 200b and then the amount of current became equal to zero. As a result, the total amount of reverse current Idiode that flowed right after the recovery operation was approximately −8 A.

FIG. 9(b) is a graph showing the recovery characteristic in a situation where Vgs of the SiC-MISFETs 200a and 200b were set to be 0 V and −10 V, respectively. In the legends attached to this graph, the reverse currents Ids are the same as what is shown in FIG. 9(a). In the SiC-MISFET 200b, by applying a negative voltage (Vgs=−10 V) to the gate, almost no current flowed (i.e., Idiode2≈0 A) before the recovery operation (i.e., before the switching MISFET was turned ON) and most of the current flowed through the SiC-MISFET 200a (i.e., Idiode1=approximately −20 A). In this case, the recovery loss is obtained by finding the integral of the products of current and voltage in a range where the reverse current Ir is negative. As can be seen from FIG. 9(b), since almost no current flowed through the SiC-MISFET 200b before the recovery operation, the reverse current did not flow so much right after the recovery operation. That is why the Idiode had a small absolute value right after the recovery operation.

Figure 10:
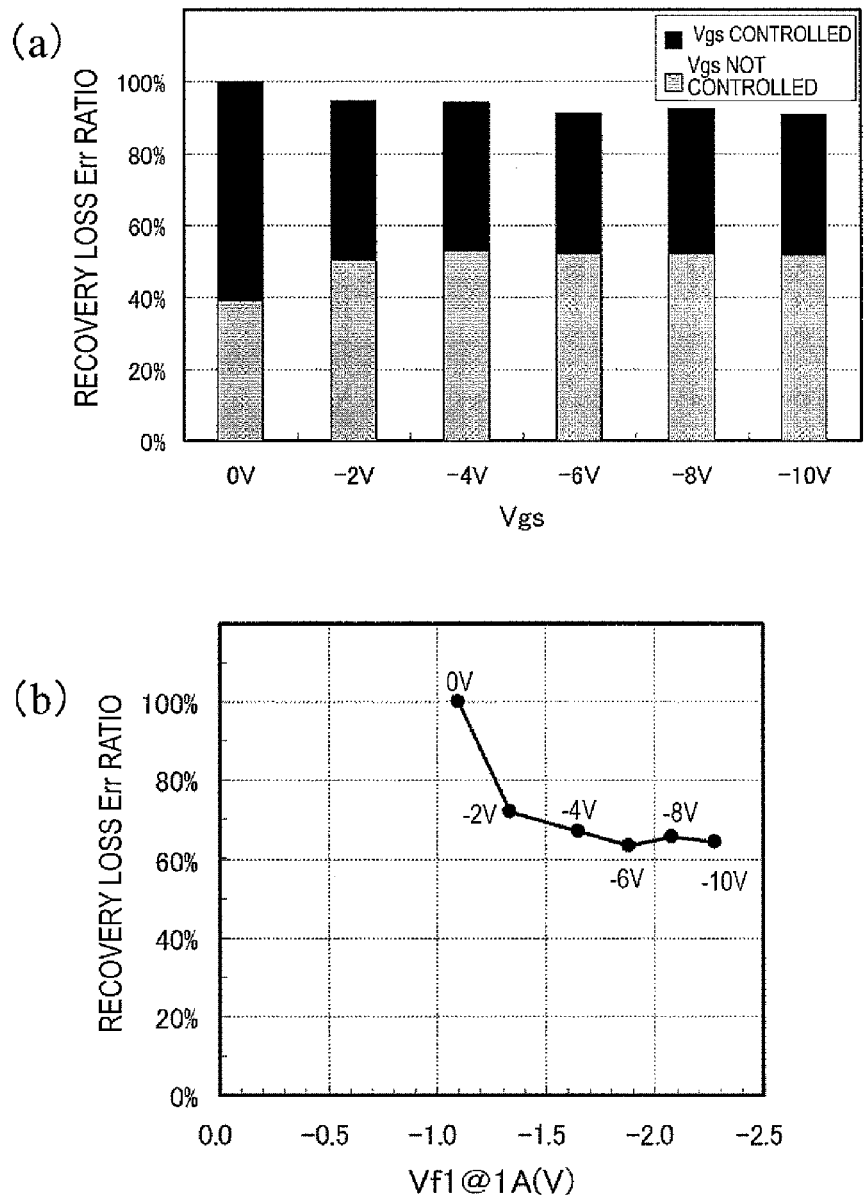
[FIG. 10]

FIG. 10(a) shows the Vgs dependence of the recovery loss value of the semiconductor element 200, of which the gate electrode is biased as shown in FIG. 8(b). In FIG. 10(a), the abscissa represents the gate voltage Vgs of the SiC-MISFET 200b and the ordinate represents the recovery loss, which is a relative value in a situation where the recovery loss when the gate voltage Vgs of the SiC-MISFET 200b is zero is supposed to be one. In FIG. 10(a), the result obtained when Vgs was 0 V represents the recovery loss value of the semiconductor element 200, of which the gate electrode is biased as shown in FIG. 8(a).

As can be seen from FIG. 10(a), in a situation where the gate voltage Vgs of the SiC-MISFET 200b is set to be negative, as its absolute value increases, the recovery loss value of the SiC-MISFET 200a somewhat increases whereas the recovery loss of the SiC-MISFET 200b decreases. As a result, the overall recovery loss of the semiconductor element 200 as a whole may decrease by as much as approximately 10%.

FIG. 10(b) shows how the recovery loss ratio changes with the turn-on voltage of the diode if Vgs of the SiC-MISFET 200b is varied. The abscissa represents the turn-on voltage Vf1 of the diode which is defined by Vds when a reverse current Ids of −1 A flows, while the ordinate represents the recovery loss of the SiC-MISFET 200b, which is indicated as a relative value with respect to the value when Vgs is equal to zero, which is supposed to be one. As can be seen from FIG. 10(b), as far as SiC-MISFET 200b is concerned, if Vgs is set to be −2 V, the recovery loss can be reduced by as much as about 28% compared to the situation where Vgs is equal to zero. And if Vgs is further decreased to or beyond −4 V, the recovery loss can be reduced by as much as about 33% compared to the situation where Vgs is equal to zero. Consequently, it can be seen that in a reverse direction mode in which a reverse current flows through the semiconductor element 200, it would be convenient to set Vgs of the SiC-MISFET 200b to be less than 0 V, more convenient to set Vgs to be −2 V or less, and even more convenient to set Vgs to be −5 V or less. this manner, by setting Vgs of the SiC-MISFET 200b to be negative in the reverse direction mode in which a reverse current flows through the semiconductor element 200, the power converter 2000 of this embodiment can reduce the recovery loss.

As can be seen from the results of measurement, the effect of reducing the recovery loss is achieved by getting the reverse direction mode current controlled by the control section for the semiconductor element shown in FIGS. 8(a) and 8(b). That is why not just the power converter of the embodiment described above but also any other semiconductor device including at least a semiconductor element and a control section that performs the control described above can achieve the effect of reducing the recovery loss as well.

Hereinafter, it will be described exactly what the timing to operate the semiconductor element 200 may be in a method for controlling a power converter according to an embodiment of the present invention.

Figure 11A:
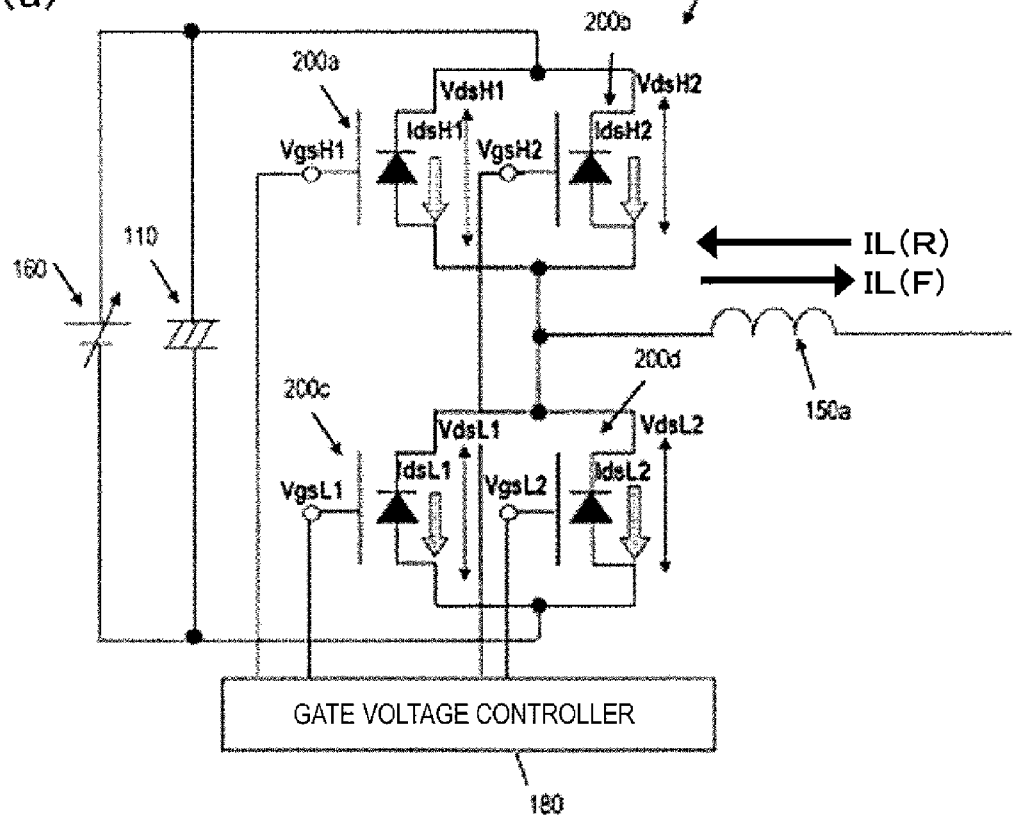
[FIG. 11] (a) is a circuit diagram illustrating only one phase portion of the power converter shown in FIG. 6A and (b) is a block diagram illustrating a configuration for the gate voltage controller.
[FIG. 11B] A chart showing the operating waveforms of the circuit shown in FIG. 11A in a situation where the Low level is set to be 0 V.
[FIG. 11C] A chart showing the operating waveforms of the circuit shown in FIG. 11A in a situation where the Low level is set to be 0 V.
[FIG. 11D] A chart showing other operating waveforms of the circuit shown in FIG. 11A in a situation where the Low level is set to be 0 V.
[FIG. 11E] A chart showing other operating waveforms of the circuit shown in FIG. 11A in a situation where the Low level is set to be 0 V.
[FIG. 11F] A chart showing the operating waveforms of the circuit shown in FIG. 11A in a situation where the Low level is set to be −5 V.
[FIG. 11G] A chart showing the operating waveforms of the circuit shown in FIG. 11A in a situation where the Low level is set to be −5 V.
[FIG. 11H] A chart showing other operating waveforms of the circuit shown in FIG. 11A in a situation where the Low level is set to be −5 V.
[FIG. 11I] A chart showing other operating waveforms of the circuit shown in FIG. 11A in a situation where the Low level is set to be −5 V.
Figure 11A:
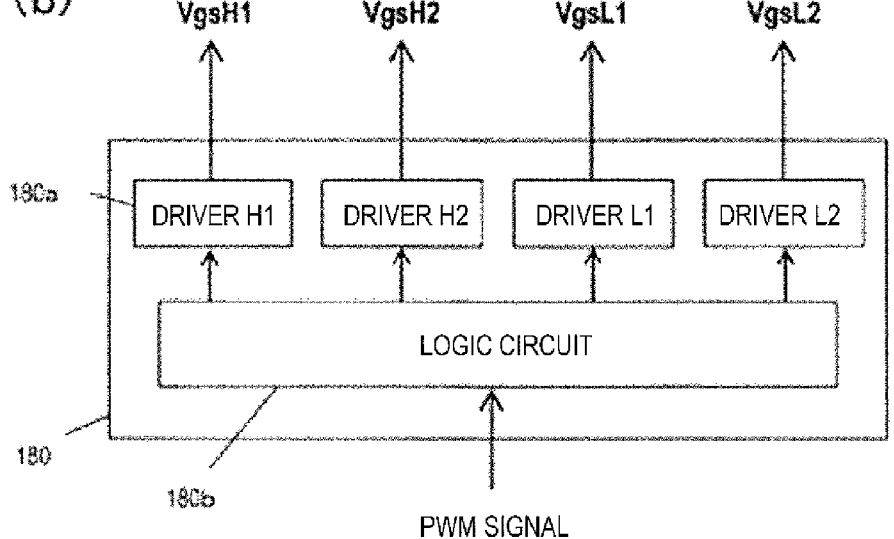

Portion (a) of FIG. 11A illustrates a configuration for one leg of the power converter 2000 of this embodiment. In portion (a) of FIG. 11A, a DC power supply 160 supplies power to an inductive load 150a such as a motor. A semiconductor element 200H of the upper arm (i.e., on High side (H)), comprised of SiC-MISFETs 200a and 200b that are connected in parallel with each other, is connected in series to a semiconductor element 200L of the lower arm (i.e., on Low side (L)), comprised of SiC-MISFETs 200c and 200d that are connected in parallel with each other. A gate voltage controller 180 drives the respective gates of the SiC-MISFETs 200a and 200b of the upper arm and those of the SiC-MISFETs 200c and 200d of the lower arm. Specifically, the gate voltage controller 180 outputs gate drive voltages VgsH1 and VgsH2 to the SiC-MISFETs 200a and 200b on the upper arm side and also outputs gate drive voltages VgsL1 and VgsL2 to the SiC-MISFETs 200c and 200d on the lower arm side.

In portion (a) of FIG. 11A, currents IdsH1, IdsH2, IdsL1 and IdsL2 to flow through the respective SiC-MISFETs as indicated by the arrows are supposed to have positive values when flowing in the direction indicated by those arrows but have negative values when flowing in the opposite direction to the one indicated by those arrows. Also, in FIG. 11A, the potential differences applied to these SiC-MISFETs are indicated by VdsH1, VdsH2, VdsL1, and VdsL2, respectively.

The inductive load 150a is driven by alternating current. Thus, as shown in FIG. 11A, current IL(R) may flow from the inductive load 150a toward the leg 210 or current IL(F) may flow from the leg 210 toward the inductive load 150a.

Portion (b) of FIG. 11A is a block diagram illustrating an exemplary configuration for the gate voltage controller 180, which includes a logic circuit 180b and a plurality of drivers 180a. In response to a PWM signal supplied from an external PWM generator, the logic circuit 180b outputs a gate signal to the respective drivers 180a. Those drivers 180a are connected to the respective gate terminals of SiC-MISFETs that form an inverter circuit. In response to the gate signal supplied from the logic circuit 180b, the respective drivers 180a apply gate drive voltages VgsH1, VgsH2, VgsL1, and VgsL2 to the respective SiC-MISFETs that are connected to them. The gate voltage controller of this embodiment may apply gate drive voltages VgsH1, VgsH2, VgsL1, and VgsL2 with the operating waveforms shown in FIGS. 11B through 11I to the respective SiC-MISFETs, for example.

Each of these drivers is an insulated driver and typically includes a pulse transformer, a photo-coupler or any other suitable circuit element. Optionally, another circuit may be attached to the gate voltage controller 180. For example, a PWM generator may be built in the gate voltage controller 180.

Figure 11B:
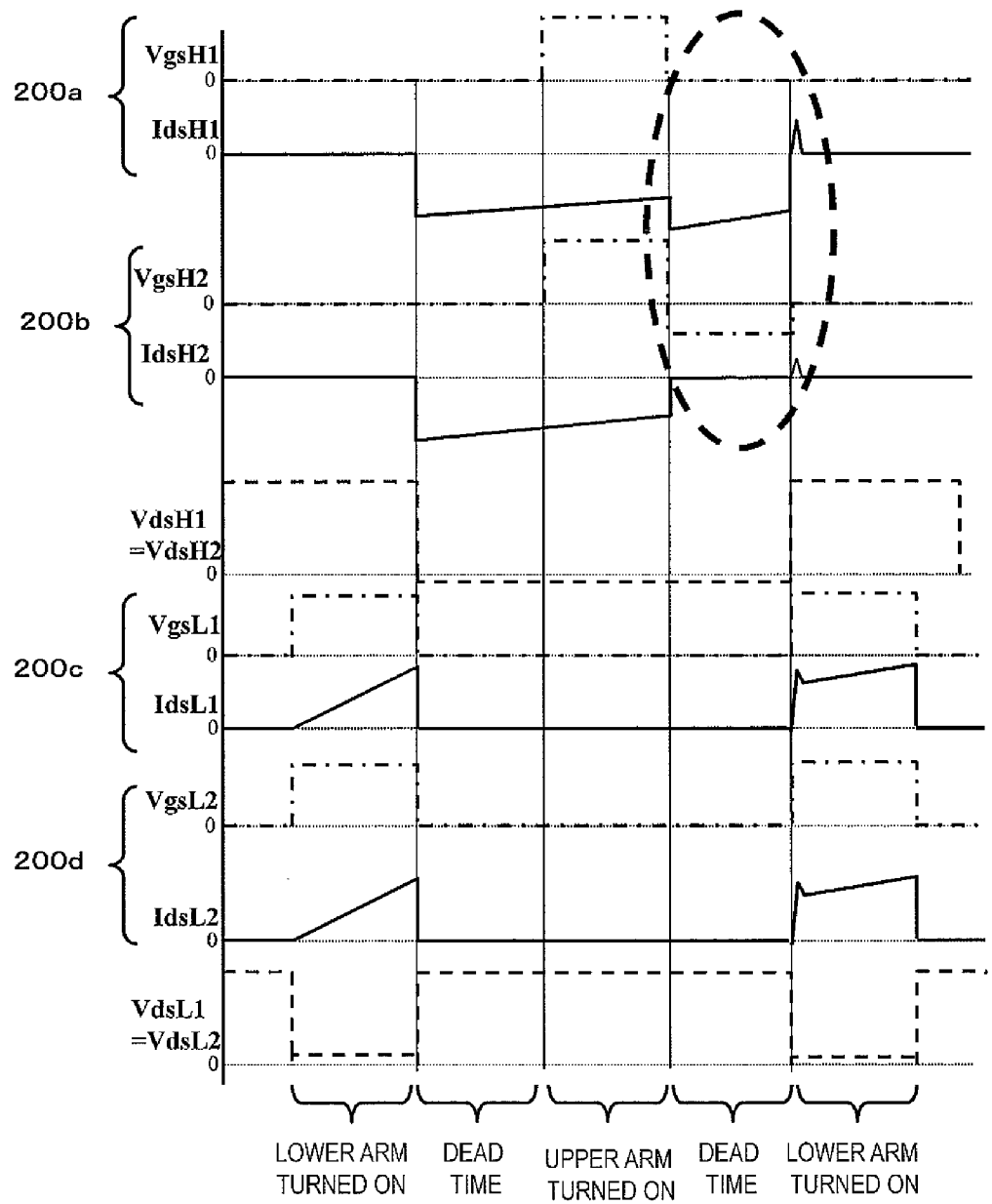

FIG. 11B shows an exemplary set of operating waveforms for the circuit shown in FIG. 11A and is a timing chart showing voltages and currents to be applied to respective parts when the current IL(R) is made to flow from the inductive load 150a toward the leg 210. In FIG. 11B, the gate drive voltages VgsH1 and VgsH2 for the upper arm and the gate drive voltages VgsL1 and VgsL2 for the lower arm alternately go high and low. That is to say, when the upper arm is in High level, the lower arm is in Low level. And when the lower arm is in High level, the upper arm is in Low level. In this description, the "High level" is supposed to be a voltage that is equal to or higher than the threshold voltage Vth of the SiC-MISFETs and the "Low level" is supposed to be a voltage that is lower than the threshold voltage Vth of the SiC-MISFETs. Specifically, the Low level is supposed to be 0 V in this example. Also, to prevent the SiC-MISFETs of the upper arm and the SiC-MISFETs of the lower arm from turning ON simultaneously and causing a short-circuit breakdown, a dead time is provided as an interval before VgsH1 and VgsH2 change into OFF state and before VgsL1 and VgsL2 change into ON state. In this description, the "dead time" refers to a period in which the gate drive voltages applied to the SiC-MISFETs of the upper arm and the SiC-MISFETs of the lower arm are both set to be the Low level.

According to the timing chart shown in FIG. 11B, Vgs is supposed to be the Low level in the initial state in both of the upper and lower arms. First, the gate drive voltages VgsL1 and VgsL2 for the lower arm rise to the High level and a forward current flows through the channel (i.e., the SiC-MISFETs 200c and 200d of the lower arm are in the forward direction mode). After that, the gate drive voltages VgsL1 and VgsL2 for the lower arm change into OFF state, and then during the dead time, the SiC-MISFETs 200a and 200b of the upper arm operate as a channel diode and current flows through them in the reverse direction (i.e., the SiC-MISFETs 200a and 200b of the upper arm are in the reverse direction mode). In this case, IdsH1 and IdsH2 have negative values.

Even if the gate drive voltages VgsH1 and VgsH2 for the upper arm rise to the High level while a reverse current is flowing through the channel diode formed by the SiC-MISFETs 200a and 200b of the upper arm, the reverse current continues to flow through the SiC-MISFETs 200a and 200b as it is.

When VgsH1 and VgsH2 of the upper arm are lowered the Low level, a negative voltage (e.g., VgsH2≥−2 V) is applied as only VgsH2 but no voltage is applied as VgsH1 (i.e., VgsH1=0 V). As a result, although the reverse current continues to flow through the SiC-MISFET 200a of the upper arm (i.e., IdsH1<0 A), the absolute value of the turn-on voltage Vf0 increases in the SiC-MISFET 200b (i.e., the I-V characteristic shifts in the negative direction in FIG. 8(c)). Consequently, the reverse diode current is shut off according to this embodiment (i.e., IdsH2≈0 A). In this case, as the reverse current flowing through the SiC-MISFET 200b is shut off (i.e., IdsH2≈0 A), the reverse current flowing through the SiC-MISFET 200a increases. Also, in this case, the number of SiC-MISFETs through which the reverse current is flowing in the upper arm is one.

Thereafter, when VgsL1 and VgsL2 of the lower arm are raised to the High level, recovery loss will be caused as a result of the recovery operation of the diode in the SiC-MISFETs 200a and 200b of the upper arm. In this operation, however, the recovery loss caused in the SiC-MISFET 200b to which a negative gate drive voltage (VgsH2≥−2 V) has been applied before the recovery operation becomes lighter than the one caused in the SiC-MISFET 200a to which no voltage (VgsH1=0 V) has been applied before the recovery operation. After that, the SiC-MISFETs 200c and 200d turn ON and current flows through the respective channels of the SiC-MISFETs 200c and 200d. Finally, VgsL1 and VgsL2 of the lower arm also change into OFF state and the state goes back to the initial one.

Figure 11C:
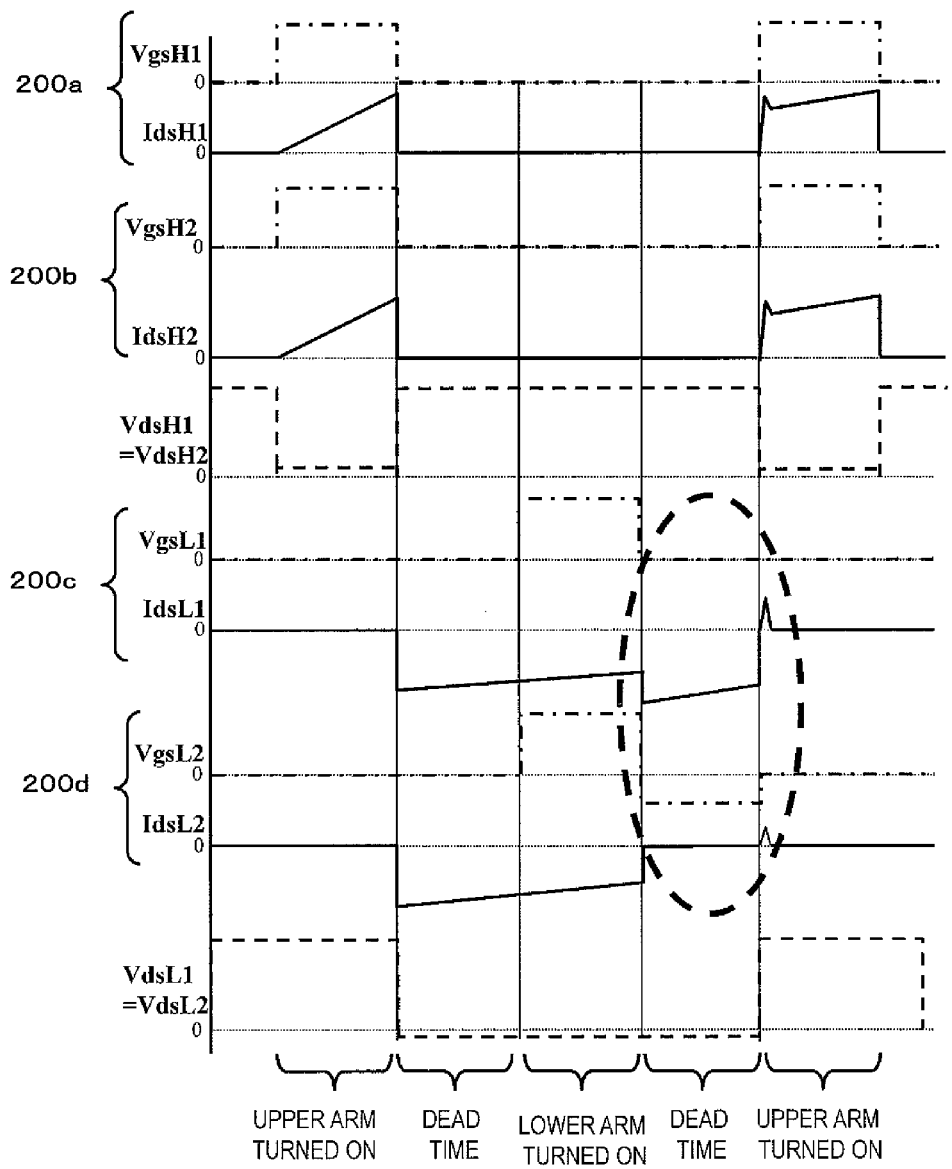

FIG. 11C shows an exemplary set of operating waveforms for the circuit shown in FIG. 11A and is a timing chart showing voltages and currents to be applied to respective parts when the current IL(F) is made to flow from the leg 210 toward the inductive load 150a. According to the timing chart shown in FIG. 11C, Vgs is supposed to be the Low level in the initial state in both of the upper and lower arms. First, the gate drive voltages VgsH1 and VgsH2 for the upper arm rise to the High level and a forward current flows through the channel (i.e., the SiC-MISFETs 200a and 200b of the upper arm are in the forward direction mode). In this case, the number of SiC-MISFETs through which the current is flowing in the upper arm is one.

After that, the gate drive voltages VgsH1 and VgsH2 for the upper arm change into OFF state, and then during the dead time, the SiC-MISFETs 200c and 200d of the lower arm operate as a channel diode and current flows through them in the reverse direction (i.e., the SiC-MISFETs 200c and 200d of the lower arm are in the reverse direction mode). In this case, IdsL1 and IdsL2 have negative values.

Even if the gate drive voltages VgsL1 and VgsL2 for the lower arm rise to the High level while a reverse current is flowing through the channel diode formed by the SiC-MISFETs 200c and 200d of the lower arm, the reverse current continues to flow through the SiC-MISFETs 200c and 200d as it is.

When VgsL1 and VgsL2 of the lower arm are lowered the Low level, a negative voltage (e.g., VgsL2≥−2 V) is applied as only VgsL2 but no voltage is applied as VgsL1 (i.e., VgsL1=0 V). As a result, although the reverse current continues to flow through the SiC-MISFET 200c of the lower arm (i.e., IdsL1<0 A), the absolute value of the turn-on voltage Vf0 increases in the SiC-MISFET 200d. Consequently, the reverse diode current is shut off according to this embodiment (i.e., IdsH2≈0 A). In this case, as the reverse current flowing through the SiC-MISFET 200b is shut off (i.e., IdsL2≈0 A), the reverse current flowing through the SiC-MISFET 200c increases.

Thereafter, when VgsH1 and VgsH2 of the upper arm are raised to the High level, recovery loss will be caused as a result of the recovery operation of the diode in the SiC-MISFETs 200c and 200d of the lower arm. In this operation, however, the recovery loss caused in the SiC-MISFET 200d to which a negative gate drive voltage (VgsL2≥−2 V) has been applied before the recovery operation becomes lighter than the one caused in the SiC-MISFET 200c to which no voltage (VgsL1=0 V) has been applied before the recovery operation. After that, the SiC-MISFETs 200a and 200b turn ON and current flows through the respective channels of the SiC-MISFETs 200a and 200b. Finally, VgsH1 and VgsH2 of the upper arm also change into OFF state and the state goes back to the initial one.

Figure 11D:
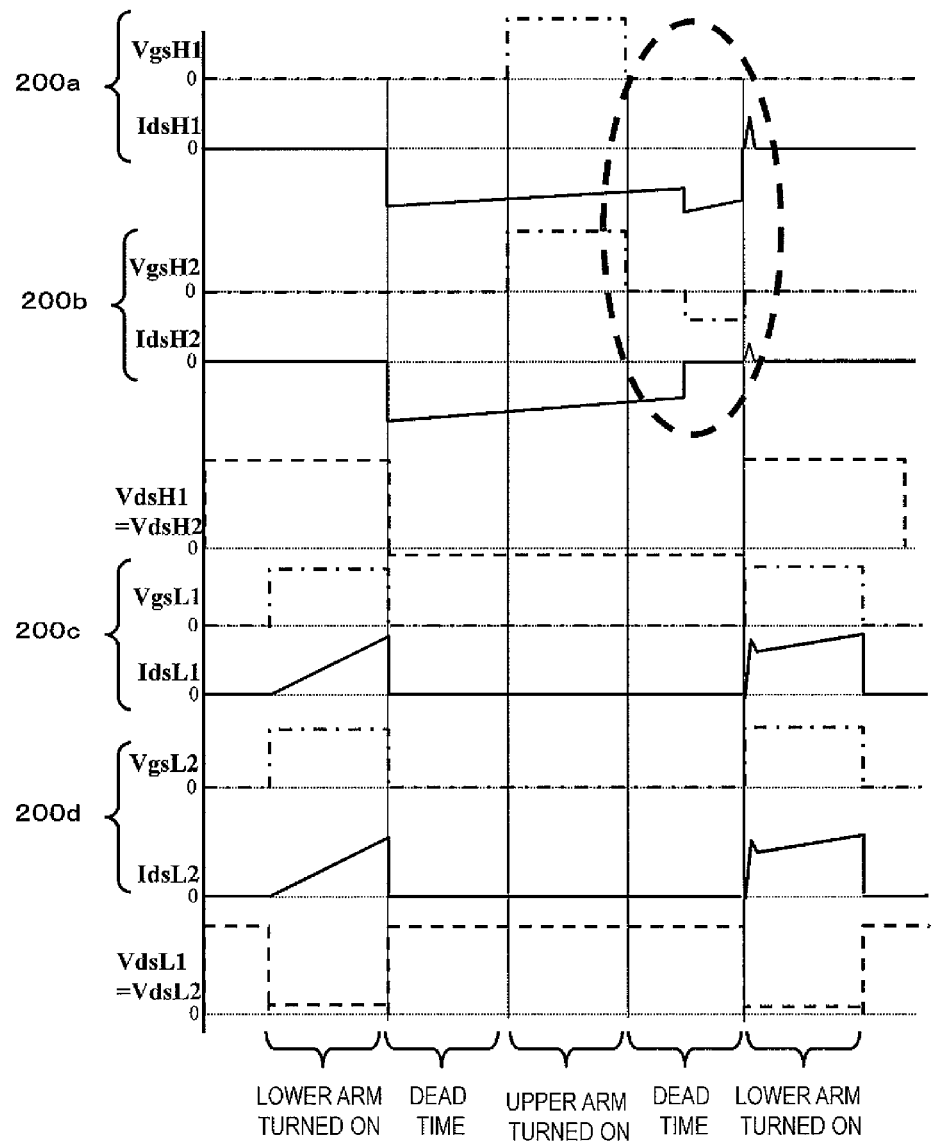

FIG. 11D shows another exemplary set of operating waveforms for the circuit shown in FIG. 11A and is a timing chart showing the voltages and currents applied to respective parts when current IL(R) is made to flow from the inductive load 150a toward the leg 210. In FIG. 11D, if the gate drive voltage VgsH2 applied to the SiC-MISFET 200b is changed steeply from a positive voltage into a negative one while VgsH1 and VgsH2 of the upper arm are lowered from the High level into the Low level, then noise could increase due to the potential variation of VgsH2. That is why when VgsH2 of the upper arm is changed into the OFF state, a zero potential (VgsH2=0 V) may be once maintained for a while and then VgsH2 may be changed into a negative voltage (e.g., VgsH2≥−2 V). Then, compared to the operation represented by the timing chart shown in FIG. 11B, the noise can be further reduced when the gate potential is changed (or switched). The state of VgsH1 of the upper arm at that timing (i.e., VgsH1=0 V) and a method for controlling the voltages and currents applied to respective parts in the other periods are just as already described with reference to FIG. 11B. Likewise, the effect of reducing the recovery loss in the SiC-MISFET 200b is also just as already described with reference to FIG. 11B.

FIG. 11E is a timing chart showing the voltages and currents applied to respective parts when current IL(F) is made to flow from the leg 210 toward the inductive load 150a in another example. In FIG. 11E, if the gate drive voltage VgsL2 applied to the SiC-MISFET 200d is changed steeply from a positive voltage into a negative one while VgsL1 and VgsL2 of the lower arm are lowered from the High level into the Low level, then noise could increase due to the potential variation of VgsL2. That is why when VgsL2 of the lower arm is changed into the OFF state, a zero potential (VgsH2=0 V) may be once maintained for a while and then VgsH2 may be changed into a negative voltage (e.g., VgsH≥−2 V). Then, compared to the operation represented by the timing chart shown in FIG. 11C, the noise can be further reduced when the gate potential is changed (or switched). The state of VgsL1 of the lower arm at that timing (i.e., VgsL1=0 V) and a method for controlling the voltages and currents applied to respective parts in the other periods are just as already described with reference to FIG. 11C. Likewise, the effect of reducing the recovery loss in the SiC-MISFET 200d is also just as already described with reference to FIG. 11C.

In the exemplary embodiment described above, the gate voltage Vgs to turn OFF the SiC-MISFETs 200a, 200b, 200c and 200d is supposed to be 0 V. That is to say, the Low level of the gate voltage applied to the upper and lower arms is set to be 0 V. However, the Low level of the gate voltage may also be set to be any other value. For example, if the Low level of the gate voltage Vgs is set to be a value that is smaller than 0 V as shown in FIG. 8(c), the voltage Vf0 at which the reverse current starts to flow through the upper and lower arms can be an even smaller value (i.e., a negative value). In that case, in the OFF state, the gate voltages Vgs of the two SiC-MISFETs are both set to be negative values. As a result, the Low level of the gate voltage Vgs may be changed, and the voltage Vf0 at which the reverse current starts to flow through the upper and lower arms can be adjusted, according to the characteristic of the inductive load 150 to be driven by the power converter 2000 of this embodiment.

Figure 11F:
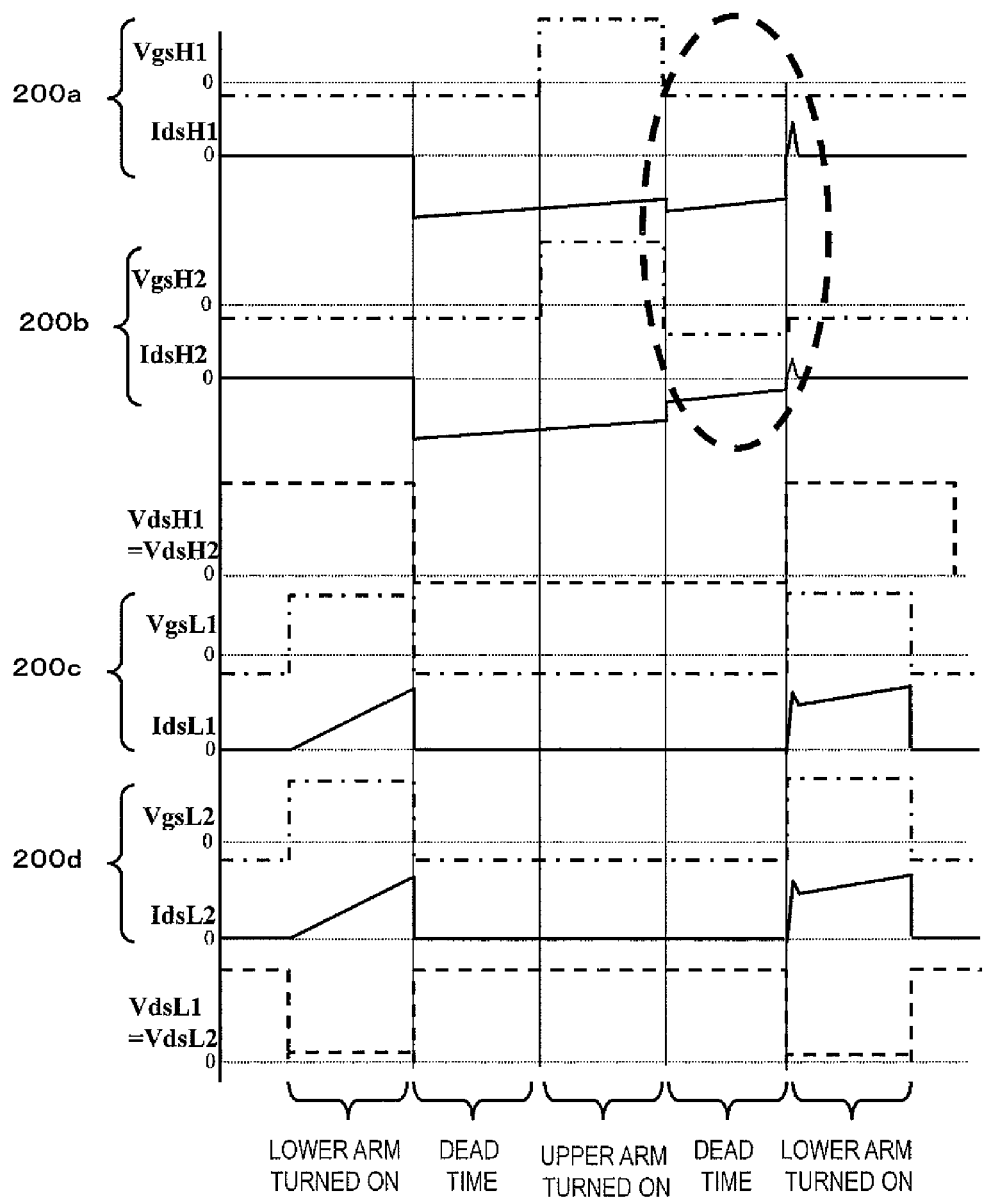
Figure 11G:
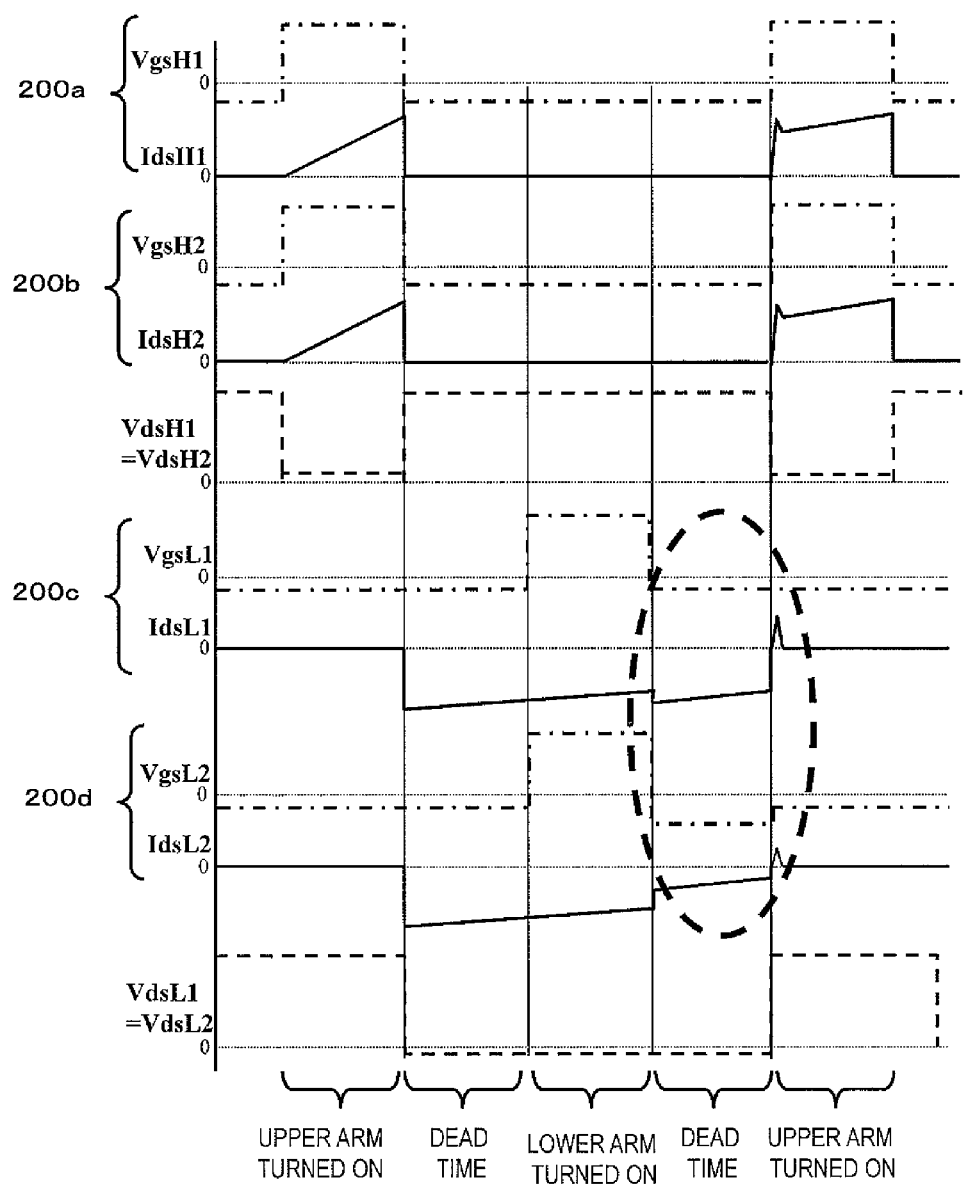
Figure 11H:
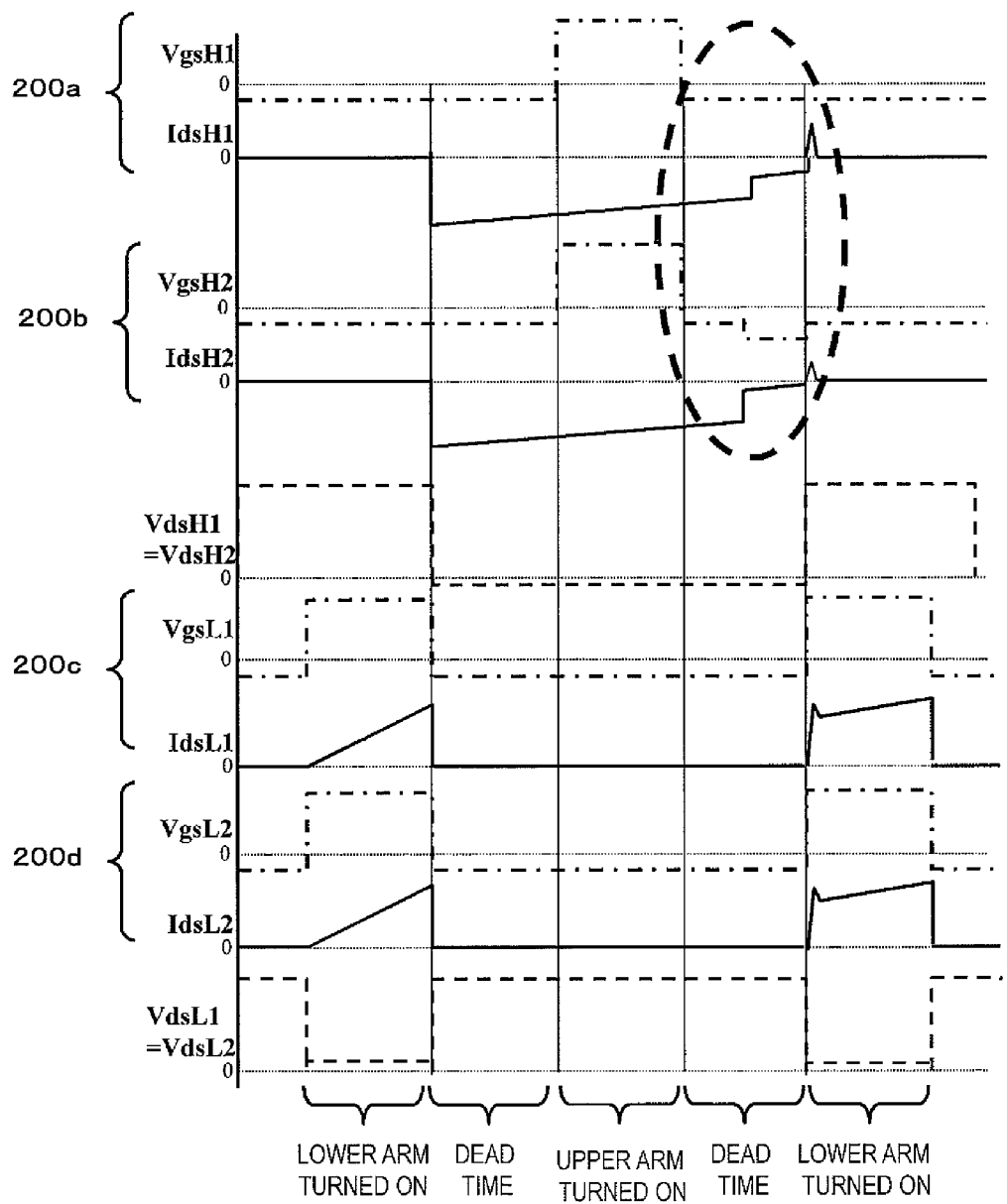
Figure 11I:
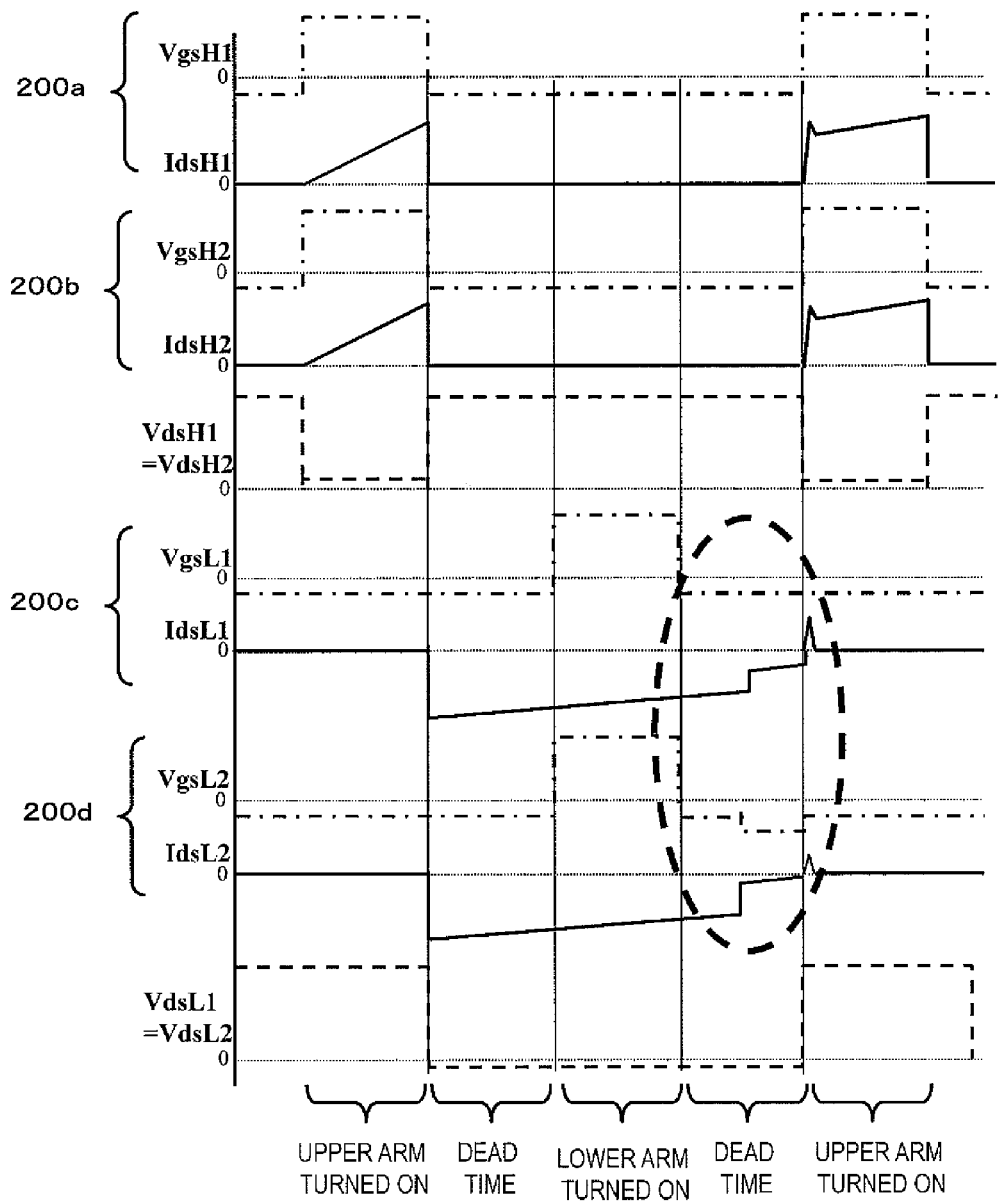

FIGS. 11F through 11I show operating waveforms for the circuit shown in FIG. 11A in a situation where the Low level of the gate voltage Vgs of the upper and lower arms is set to be −5 V. FIGS. 11F and 11G correspond to FIGS. 11B and 11C, respectively. The gate voltages VgsH2 and VgsL2 applied to the SiC-MISFETs 200b and 200d that shut off the reverse diode current in the upper and lower arms all through the dead time are set to be −10 V, for example. FIGS. 11H and 11I correspond to FIGS. 11D and 11E, respectively. The gate voltages VgsH2 and VgsL2 applied to the SiC-MISFETs 200b and 200d that shut off the reverse diode current in the upper and lower arms during a part of the dead time are set to be −10 V, for example. In this manner, even if the Low level of the SiC-MISFET is set to be −5 V, the reverse diode current can also be reduced and the recovery loss caused in the upper and lower arms can be cut down by applying a gate voltage that is even smaller (but that has a greater absolute value) than Vgs of the Low level that has been set.

Although the timings of operation of only one leg of the semiconductor element 200 have been described with reference to FIGS. 11A, 11B and 11C, the same statement also applies to the timings of operation of the entire power converter 2000. The gate voltage controller 180 of the power converter 2000 may include a PWM controller to drive the respective legs at the timings described above with the phases shifted from each other.

As described above, according to this embodiment, in a situation where the respective semiconductor elements 200 of the upper and lower arms are driven so as to turn ON alternately, a gate drive voltage Vgs applied to the SiC-MISFET 200b of the semiconductor element 200 of the upper or lower arm is set to be a negative voltage during at least a part of the dead time in which those semiconductor elements 200 of the upper and lower arms turn OFF simultaneously. As a result, the recovery loss caused by the semiconductor elements 200 can be reduced.

In the embodiment described above, the gate voltages Vgs are set so as to prevent reverse diode current from flowing through one of the two SiC-MISFETs in each of the upper and lower arms at a predetermined timing. In the embodiment described above, only two SiC-MISFETs are supposed to be connected in parallel with each other for the sake of simplicity. However, the same effect can also be achieved even if three or more SiC-MISFETs are connected in parallel with each other. That is to say, by driving at least two of those SiC-MISFETs as described above, the effect of reducing the recovery loss can also be achieved. In that case, the number of SiC-MISFETs through which current flows in the reverse direction mode is smaller than that of SiC-MISFETs through which current flows in the forward direction mode.

Also, in the foregoing description, it has been described how to set the gate voltage Vgs suitably so as to prevent reverse current from flowing through one of the two SiC-MISFETs (i.e., Ids≈0 A). However, the recovery loss can also be reduced if the gate voltages are set so that the absolute value of the reverse current to flow through one of the two SiC-MISFETs becomes smaller than that of the reverse current to flow through the other. Specifically, by setting Vgs applied to one of the two SiC-MISFETs to be smaller (but to have a greater absolute value) than Vgs applied to the other in OFF state, the amount of the reverse diode current to flow through the one SiC-MISFET can be smaller than that of the reverse diode current to flow through the other. As a result, as already described with reference to FIG. 10(b), the effect of reducing the recovery loss can be achieved. This effect can be achieved remarkably if the difference in Vgs between the two SiC-MISFETs is equal to or greater than −2 V. And if the difference is −5 V or more, then the recovery loss can be reduced sufficiently.

In the embodiment described above, the power converter 2000 includes vertical SiC-MISFETs such as the one shown in FIG. 1(a) as the SiC-MISFETs 200a and 200b. However, a power converter 2000 as another embodiment may include lateral SiC-MISFETs or trenched SiC-MISFETs as the SiC-MISFETs 200a and 200b as well.

Also, in the embodiment described above, the semiconductor element 200 of each arm is supposed to include two SiC-MISFETs. However, the number of SiC-MISFETs to provide does not have to be two but may also be any other number as long as the reverse current is shut off in any of multiple SiC-MISFETs and the other SiC-MISFETs can function as a diode during at least a part of the dead time. Furthermore, although the gate voltage Vgs to be applied while the SiC-MISFETs are operating as a diode is supposed to be 0 V in the embodiment described above, this is just an example of the present invention and the gate voltage Vgs may be changed appropriately according to the intended use.

Figure 12:
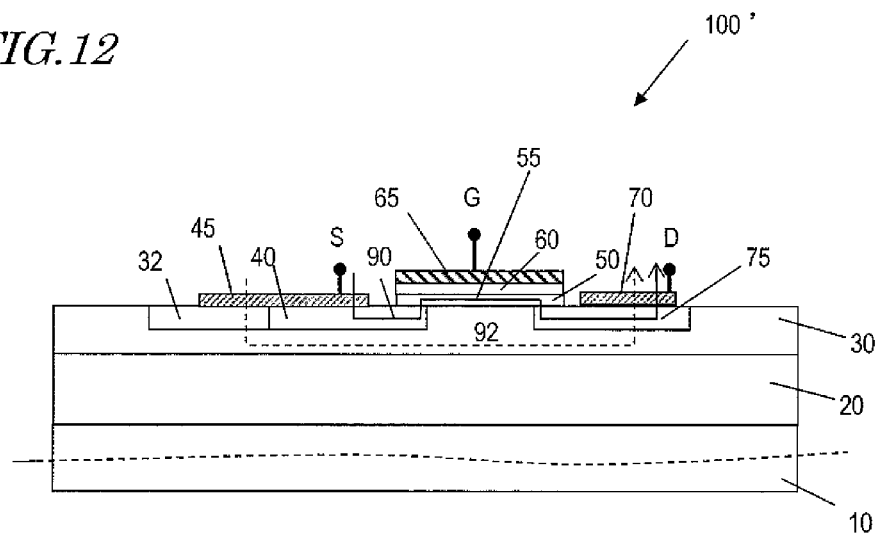
[FIG. 12] A schematic cross-sectional view illustrating another example of a semiconductor element that can be used in the circuit shown in FIG. 6A.

FIG. 12 schematically illustrates the structure of one unit cell of a lateral SiC-MISFET 100'. The lateral SiC-MISFET 100' includes a source region 40 and a drain region 75 which are arranged at a predetermined interval in a p-body region 30 and also includes a channel layer 50 which is arranged between the source and drain regions 40, 75 and over the p-body region 30. A source electrode 45 and a drain electrode 70 are connected to the source region 40 and the drain region 75, respectively. Also, a gate electrode 65 is arranged over the channel layer 50 with a gate insulating film 60 interposed between them. The source electrode 45 is also electrically connected to a p-body contact region 32, which forms part of the p-body region 30. In such a lateral SiC-MISFET 100', by adjusting the thickness and the dopant concentration of the channel layer 50, the absolute value of the turn-on voltage of the channel diode can be set to be smaller than that of the turn-on voltage of the body diode. As a result, a freewheeling diode, which has a current path leading from the source region 40 to the drain region 75 via the channel layer 50, is realized.

Figure 13:
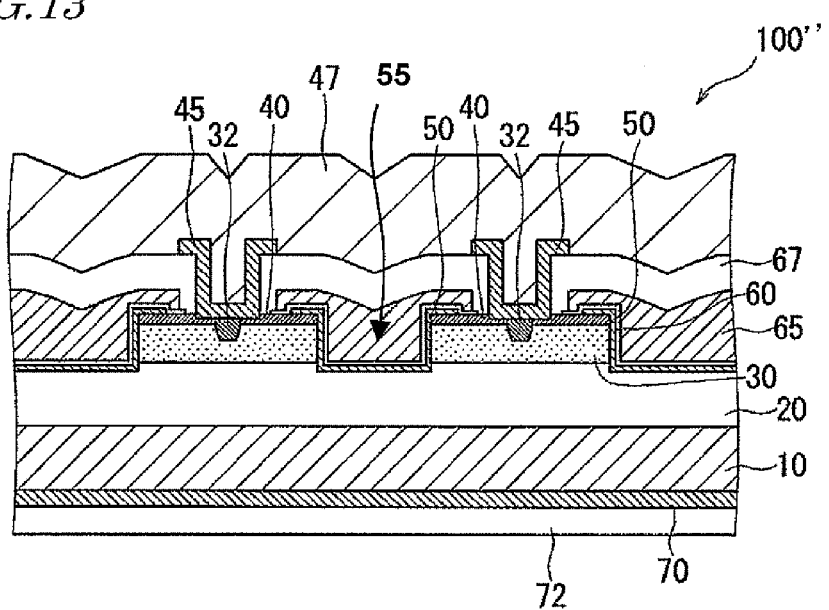
[FIG. 13] A schematic cross-sectional view illustrating another example of a semiconductor element that can be used in the circuit shown in FIG. 6A.

FIG. 13 schematically illustrates the structure of one unit cell of a trenched SiC-MISFET 100", which includes a p-body region 30 defined in a drift layer 20 and a source region 40 that is arranged over the p-body region 30. trench 55 has been cut through the p-body region 30 to reach the drift layer 20 and the inner side surface of the trench 55 is covered with a channel layer 50. A gate electrode 65 is arranged over the channel layer 50 with a gate insulating film interposed between them. Even in such a trenched SiC-MISFET 100", by adjusting the thickness and the dopant concentration of the channel layer 50, the absolute value of the turn-on voltage of the channel diode can also be set to be smaller than that of the turn-on voltage of the body diode. As a result, a freewheeling diode, which has a current path leading from the source region 40 to the drain electrode 70 via the channel layer 50, is realized.

Figure 6B:
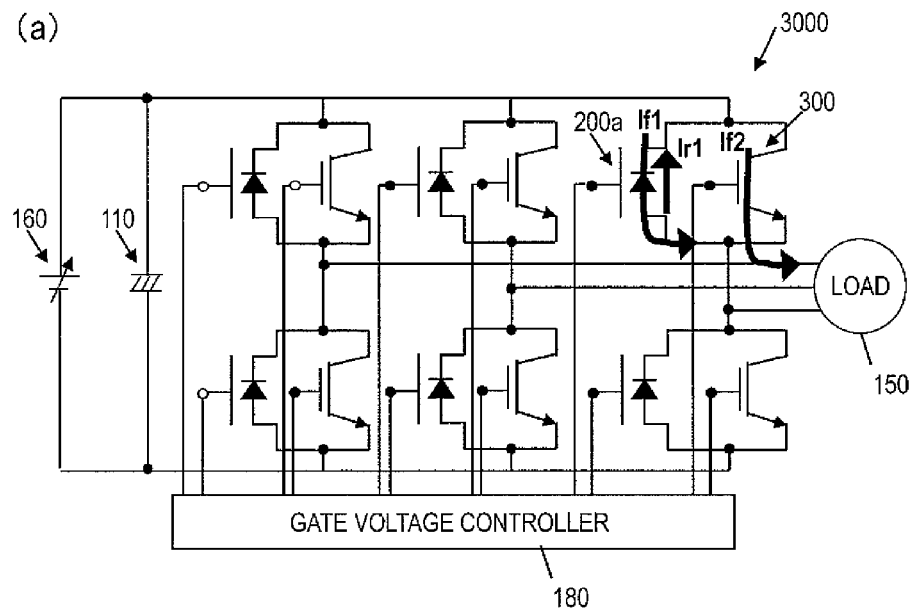
[FIG. 6B] (a) and (b) of FIG. 6B are circuit diagrams illustrating other embodiments of a power converter according to the present invention.
Figure 6B:
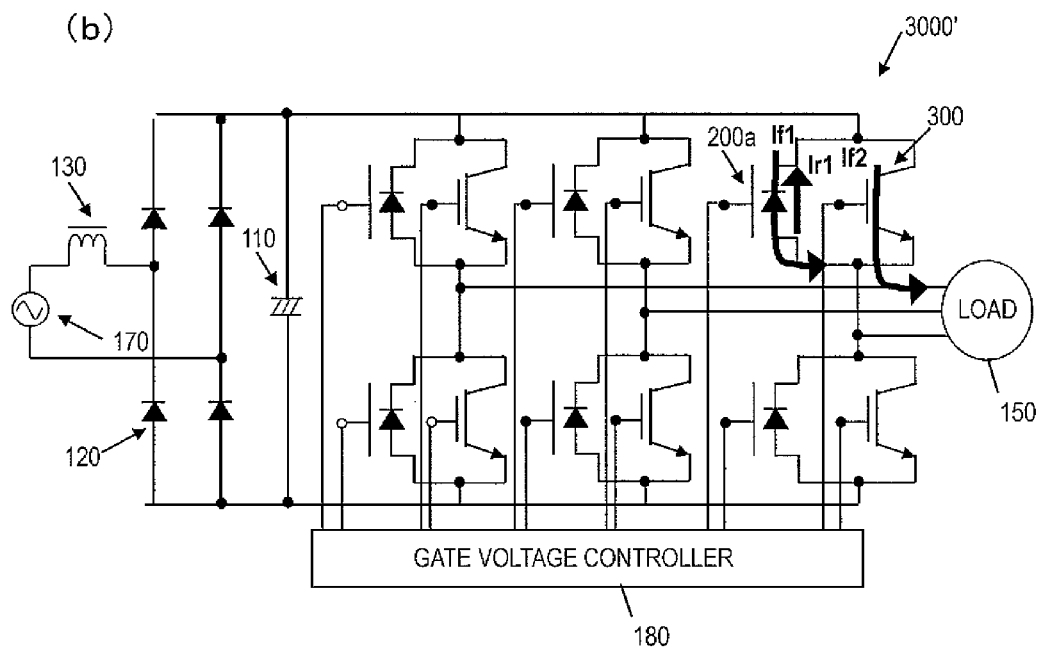

Also, in this embodiment, the SiC-MISFET 200b to which a negative gate voltage is applied in the reverse direction mode does not function as a freewheeling diode. That is why the SiC-MISFET 200b does not have to be a SiC-DioMOS but has only to have a transistor characteristic to say the least. For example, portions (a) and (b) of FIG. 6B illustrate circuit configurations for power converters 3000 and 3000' that use an insulated gate bipolar transistor 300 instead of the SiC-MISFET 200b. With the insulated gate bipolar transistor 300 adopted, even if the gate voltage is not negatively biased, no reverse current flows through the insulated gate bipolar transistor 300. That is why even if the insulated gate bipolar transistor 300 is driven with the same drive voltage applied and at the same timing as the SiC-MISFET 200a, the recovery loss caused in the power converter 3000 can also be reduced.

Figure 6C:
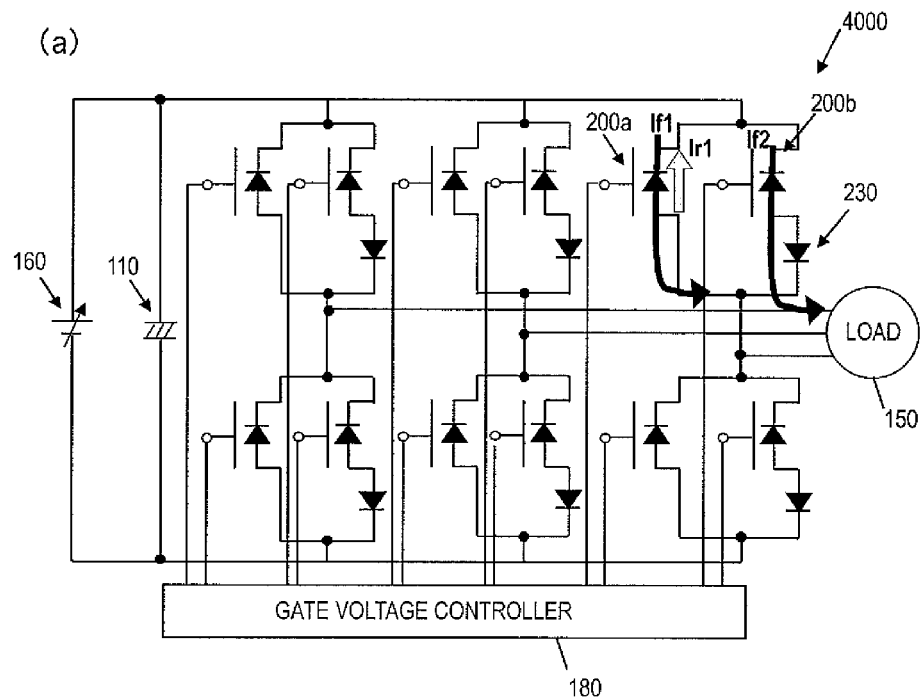
[FIG. 6C] (a) and (b) of FIG. 6C are circuit diagrams illustrating other embodiments of a power converter according to the present invention.
Figure 6C:
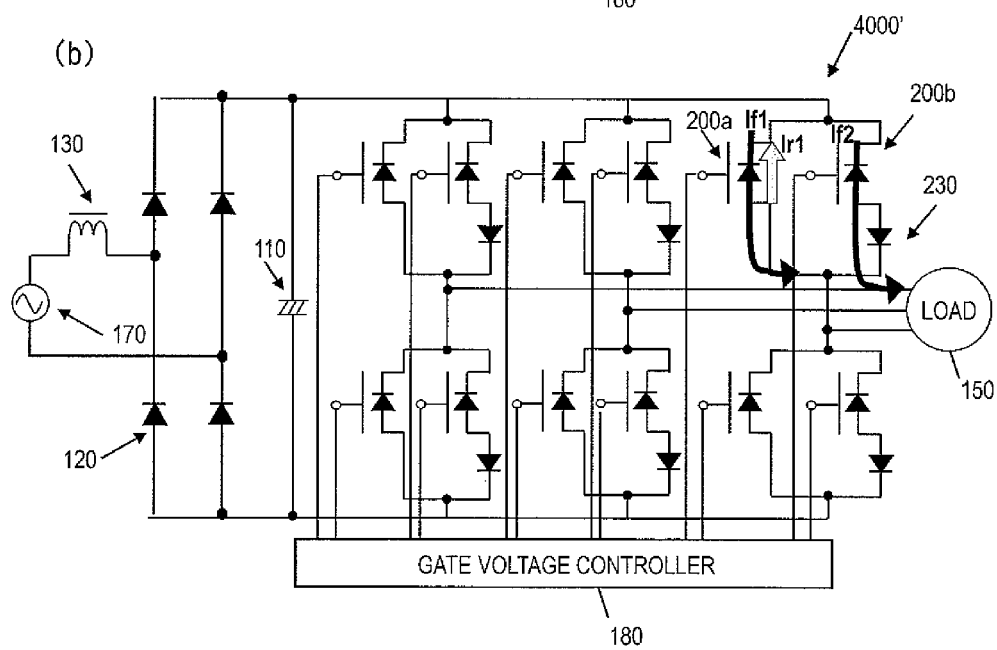

Still alternatively, as shown in portions (a) and (b) of FIG. 6C, a diode may be inserted into each arm of the power converters 2000 and 2000' shown in portions (a) and (b) of FIG. 6A. Each of the power converters 4000 and 4000' shown in portions (a) and (b) of FIG. 6C further includes a diode 230 which is directly connected to SiC-MISFET 200b in each arm of each leg.

If the diode 230 has a positive turn-on voltage, no current flows through the SiC-MISFET 200b and the SiC-MISFET 200b cannot operate as a freewheeling diode due to the rectification action of the diode 230 in the reverse direction mode. As a result, the recovery loss caused in the power converters 4000 and 4000' can be reduced.

(Embodiment 2)

Hereinafter, a second embodiment of a semiconductor element according to the present invention will be described.

Figure 3:
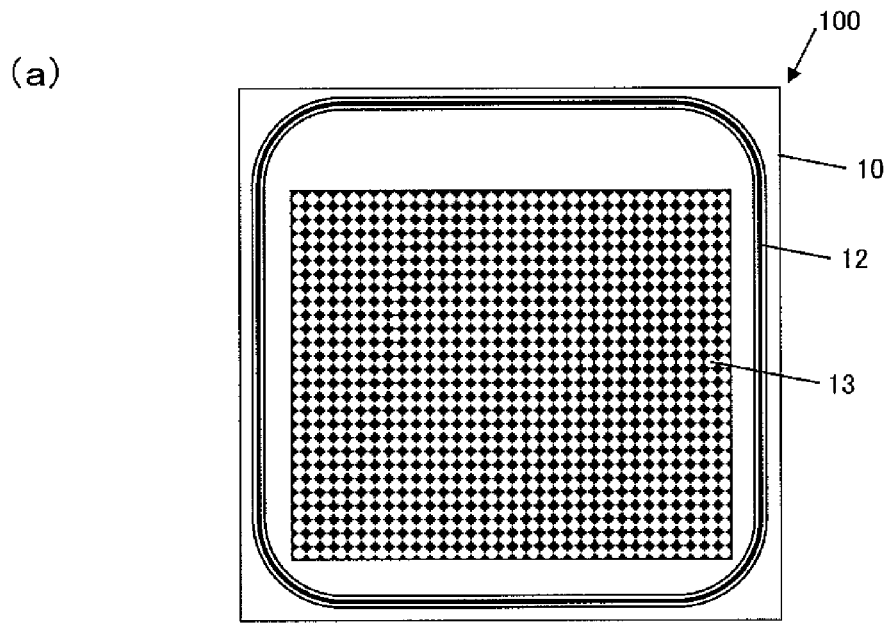
[FIG. 3]
Figure 3:
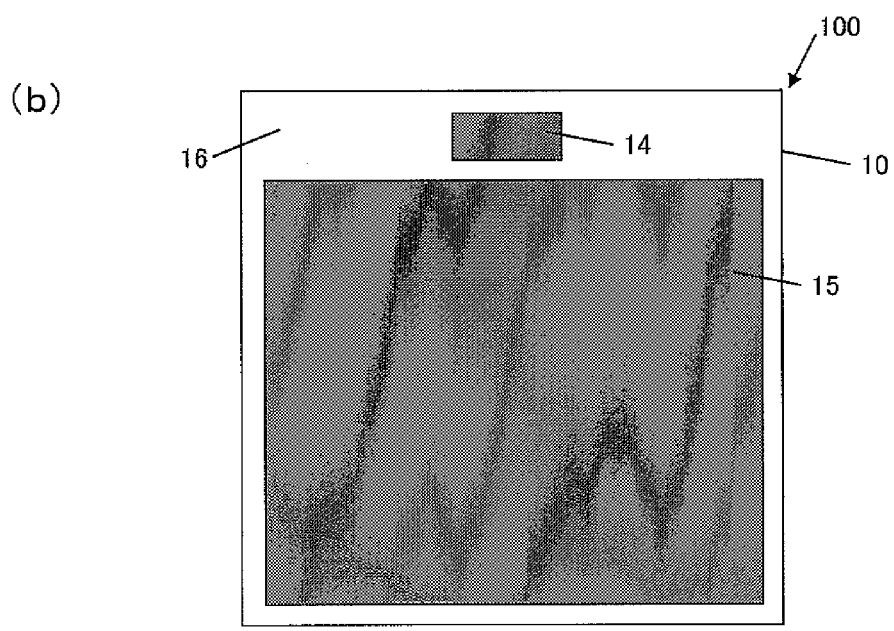

As already described for the first embodiment, each of the SiC-MISFETs 200a and 200b may have a normal three-terminal package form (e.g., TO220) with gate, source and drain terminals as shown in FIG. 3. In that case, the respective active regions 13 of the SiC-MISFETs 200a and 200b are separately packaged on two different substrates.

Figure 14:
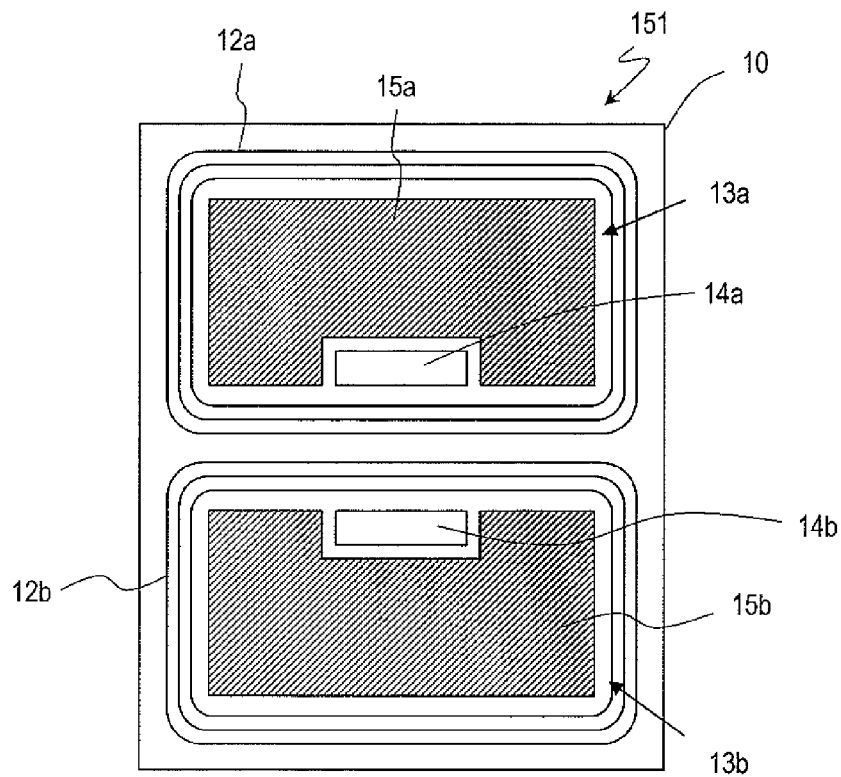
[FIG. 14] A plan view illustrating another embodiment of a semiconductor element according to the present invention.

Meanwhile, the SiC-MISFETs 200a and 200b of this embodiment are characterized by being arranged on the same substrate. FIG. 14 schematically illustrates a planar structure of a semiconductor element 201 as a second embodiment of the present invention. The semiconductor element 202 includes SiC-MISFETs 200a and 200b that are arranged on the same silicon carbide substrate 10. Each of the SiC-MISFETs 200a and 200b has a number of unit structures, each having the structure shown in FIG. 1(a). The SiC-MISFETs 200a and 200b may be arranged in active regions 13a and 13b, respectively.

The semiconductor element 202 includes a gate electrode pad 14a and a girdling 12a. The gate pad is connected to the gate electrode of the SiC-MISFET cell in the active region 13a and to a gate line (not shown). The girdling 12a is provided as a terminal structure around the active region 13a and the gate electrode pad 14a.

Likewise, also arranged are another gate electrode pad 14b to be connected to the gate line and another girdling 12b that surrounds as a terminal structure the active region 13b and the gate electrode pad 14b.

The source electrode pad 15a is electrically connected to every source electrode in the active regions 13a and 13b. In other words, the respective source electrodes in the active regions 13a and 13b are connected in parallel with each other with the source electrode pad 15. Although not shown, the back surface of the substrate is entirely covered with a drain electrode. That is to say, the respective drain electrodes in the active regions 13a and 13b are also connected in parallel with each other. By adopting such a configuration, the wires to connect the source electrodes or drain electrodes in parallel can have a shorter length compared to a situation where separately packaged SiC-MISFETs are externally connected in parallel with each other. As a result, the parasitic inductance, and eventually the switching noise, can be reduced.

Although the SiC-MISFETs 200a and 200b have their source regions and drain regions connected together in parallel, the gate voltages applied to the active regions 13a and 13b can be controlled independently because the gate electrode pads are provided separately. That is why by setting the gate voltage of the SiC-MISFET 200b to be negative when the SiC-MISFET 200a operates as a channel diode, the recovery loss can be reduced. In addition, by using the semiconductor element of this embodiment, the loss caused by the power converter can be reduced, too.

(Embodiment 3)

Figure 15:
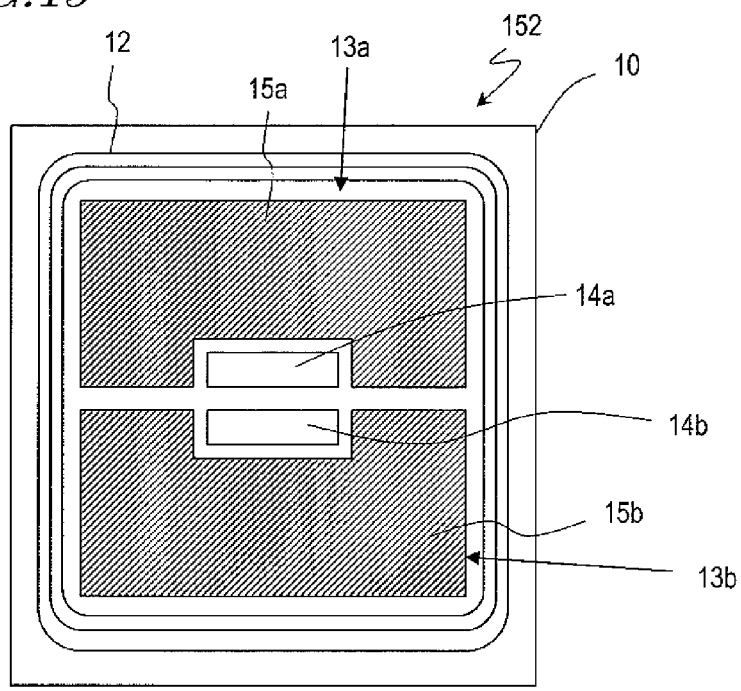
[FIG. 15] A plan view illustrating another embodiment of a semiconductor element according to the present invention.

FIG. 15 schematically illustrates the planar structure of a semiconductor element 202 as a third embodiment of the present invention. The semiconductor element 202 also includes SiC-MISFETs 200a and 200b that are arranged on the same silicon carbide substrate 10 but has a girdling region 12 that is provided in common to surround both of the active regions 13a and 13b, which is a difference from the second embodiment described above.

As shown in FIG. 15, the SiC-MISFETs 200a and 200b may be arranged in active regions 13a and 13b, respectively.

In this semiconductor element 202, a gate electrode pad 14a is arranged on the silicon carbide substrate 10. The gate electrode pad 14a is connected to the gate electrode of the SiC-MISFET 200a in the active region 13a and to a gate line (not shown). Likewise, another gate electrode pad 14b is arranged on the silicon carbide substrate 10 and is connected to the gate electrode of the SiC-MISFET 200b in the active region 13b and to the gate line (not shown). The semiconductor element 202 further includes a girdling 12 which is arranged on the silicon carbide substrate 10 as a terminal structure that surrounds all of the active regions 13a and 13b and the gate electrode pads 14a and 14b. The source electrode pad 15a is electrically connected to the source electrode of each and every one of the units in the active region 13a. In the same way, the source electrode pad 15b is electrically connected to the source electrode of each and every one of the units in the active region 13b. Furthermore, the source electrode pad 15b is electrically connected to the source electrode pad 15a.

This semiconductor element 202 can shorten the length of the wires to connect the source electrodes or drain electrodes in parallel compared to a situation where separately packaged SiC-MISFETs are externally connected in parallel with each other. As a result, the parasitic inductance, and eventually the switching noise, can be reduced. In addition, since this semiconductor element 202 includes the girdling 12 that surrounds both of the active regions 13a and 13b, the overall area of the chip, and eventually the manufacturing cost, can be cut down.

Although the source regions and drain regions are connected together in parallel, the gate voltages applied to the active regions 13a and 13b can be controlled independently because the gate electrode pads are provided separately. That is why by setting the gate voltage of the SiC-MISFET 200b to be negative when the SiC-MISFET 200a operates as a channel diode, the recovery loss can be reduced. In addition, by using the semiconductor element of this embodiment, the loss caused by the power converter can be reduced, too.

Besides, the package of the semiconductor element may be modified in various manners. For example, the semiconductor element 203 shown in FIG. 16(a) has four active regions 13a, 13b, 13c and 13d, which are arranged on the same substrate. By changing connections between the source, drain and gate electrodes of the SiC-MISFETs provided for these four active regions 13, the area ratio of independently controllable active regions can be changed.

Figure 16:
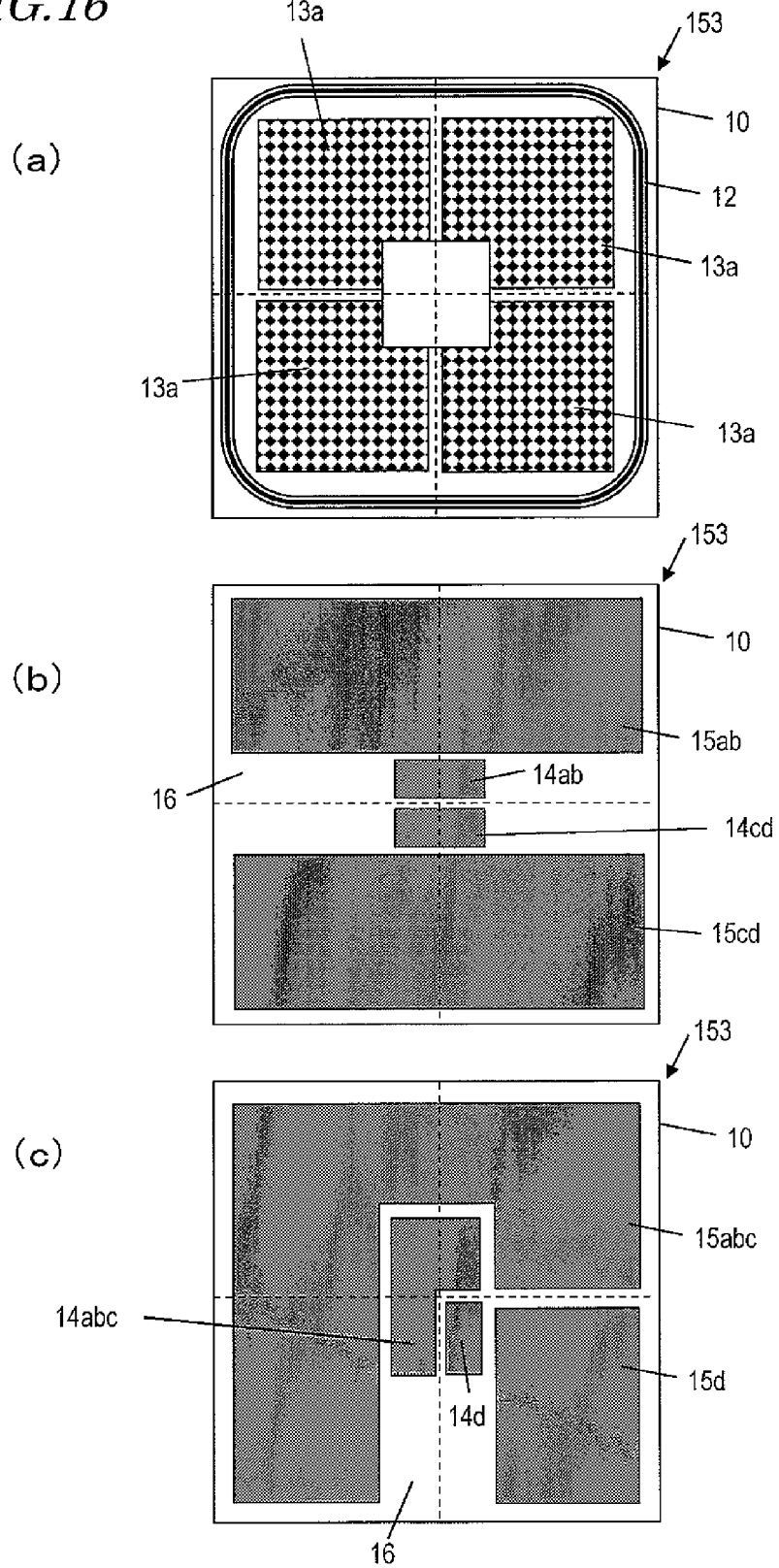
[FIG. 16]
Figure 17:
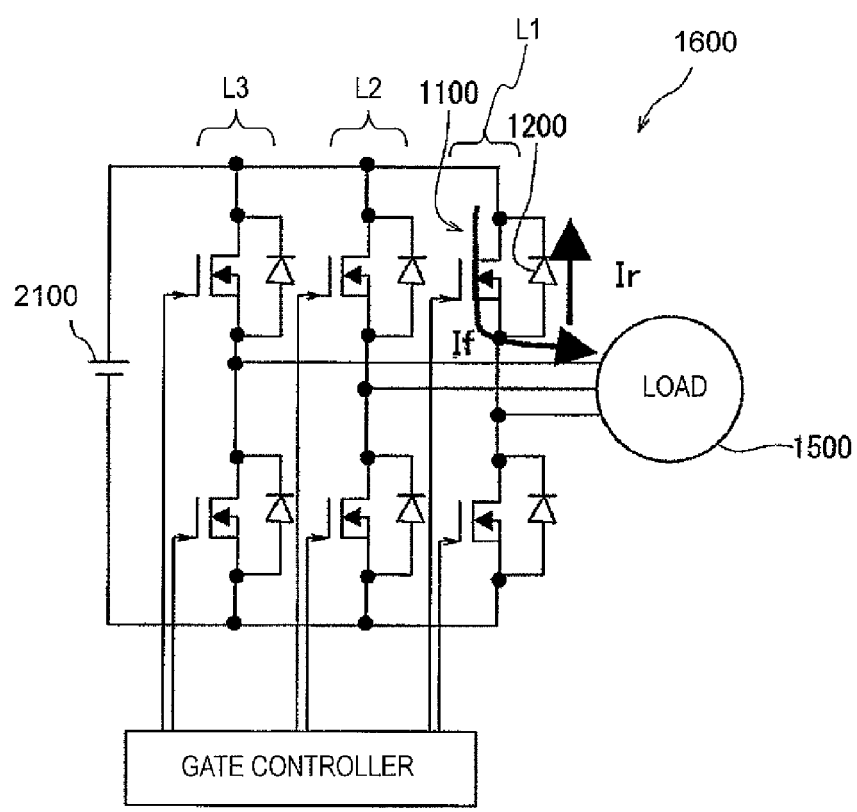
[FIG. 17] A circuit diagram illustrating a configuration for a known power converter.

FIG. 16(b) is a plan view illustrating a semiconductor element that has two active regions with an area ratio of one to one. The respective source electrodes of the SiC-MISFETs that are arranged in the active regions 13a and 13b are both connected to the same source electrode pad 15ab and their gate electrodes are both connected to the same gate electrode pad 14ab. In the same way, the respective source electrodes of the SiC-MISFETs that are arranged in the active regions 13c and 13d are both connected to the same source electrode pad 15cd and their gate electrodes are both connected to the same gate electrode pad 14cd. As a result, this semiconductor element 203 comes to have two independent SiC-MISFETs 200a and 200b that have a drive current ratio of one to one.

On the other hand, FIG. 16(c) is a plan view illustrating a semiconductor element that has two active regions with an area ratio of three to one. The respective source electrodes of the SiC-MISFETs that are arranged in the active regions 13a, 13b and 13c are all connected to the same source electrode pad 15abc and their gate electrodes are all connected to the same gate electrode pad 14abc. Meanwhile, the source electrode of the SiC-MISFET arranged in the active region 13d is connected to the source electrode pad 15d and its gate electrode is connected to the gate electrode pad 14d. As a result, this semiconductor element 203 comes to have two independent SiC-MISFETs 200a and 200b that have a drive current ratio of three to one.

INDUSTRIAL APPLICABILITY

The present disclosure provides an embodiment of a semiconductor device and method for controlling a semiconductor element which can reduce the switching loss to be caused by a SiC semiconductor device without increasing the number of parts. Among other things, a power converter that can deal with an application that needs a lot of current by controlling a plurality of SiC semiconductor elements is provided.

Reference Signs List 10 substrate (silicon carbide substrate)
12, 12a, 12b girdling (FLR) region
13, 13a, 13b, 13c, 13d active region
14, 14a, 14b, 14ab, 14cd, 14ab, 14d gate electrode pad
15, 15a, 15b, 15ab, 15cd, 15abc, 15d source electrode pad
16 protective insulating film (passivation film)
20 first silicon carbide semiconductor layer (drift layer)
30 body region (well region)
32 body contact region
40 source region
45 source electrode
50 channel layer
55 trench
60 gate insulating film
65 gate electrode
70 drain electrode
100, 200, 201, 202, 203 semiconductor element
110 capacitive element 120 rectifying diode element
130 inductive element
150 load
160 DC power supply
170 AC power supply
180 gate voltage controller
1000, 1000', 2000, 2000', 3000, 3000', 4000, 4000' power converter

The invention claimed is:

1. A semiconductor device comprising:
a semiconductor element including a first metal-insulator-semiconductor field-effect transistor and a second metal-insulator-semiconductor field-effect transistor which is connected in parallel with the first metal-insulator-semiconductor field-effect transistor; and
a control section which controls the operation of the semiconductor element, and
wherein each of the first and second metal-insulator-semiconductor field-effect transistors includes:
a source electrode;
a drain electrode;
a gate electrode; and
a silicon carbide semiconductor layer which functions as a channel, and
wherein the direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, and
wherein the control section is configured to control the semiconductor element so that in a forward direction mode, current flows in the forward direction through the first and second metal-insulator-semiconductor field-effect transistors but that in a reverse direction mode, current flows in the reverse direction through the first metal-insulator-semiconductor field-effect transistor and the amount of reverse current flowing through the second metal-insulator-semiconductor field-effect transistor becomes smaller than that of reverse current flowing through the first metal-insulator-semiconductor field-effect transistor.

2. The semiconductor device of claim 1, wherein the first and second metal-insulator-semiconductor field-effect transistors have the same transistor characteristic.

3. The semiconductor device of claim 1, wherein the potential of the gate electrode with respect to the source electrode is defined to be Vgs, and
wherein the control section is configured so that in the reverse direction mode, the second metal-insulator-semiconductor field-effect transistor has a smaller Vgs than the first metal-insulator-semiconductor field-effect transistor.

4. The semiconductor device of claim 3, wherein the control section is configured so that a difference in Vgs between the first and second metal-insulator-semiconductor field-effect transistors becomes equal to or greater than 2 V.

5. The semiconductor device of claim 4, wherein the control section is configured so that Vgs of the first and second metal-insulator-semiconductor field-effect transistors both become negative values.

6. The semiconductor device of claim 5, wherein the control section is configured so that a difference in Vgs between the first and second metal-insulator-semiconductor field-effect transistors becomes equal to or greater than 5 V.

7. The semiconductor device of claim 3, wherein the control section is configured to set Vgs of the first and second metal-insulator-semiconductor field-effect transistors to be equal to 0 V and less than 0 V, respectively, in the reverse direction mode.

8. The semiconductor device of claim 1, wherein the first and second metal-insulator-semiconductor field-effect transistors are arranged on mutually different substrates.

9. The semiconductor device of claim 1, wherein the first and second metal-insulator-semiconductor field-effect transistors are arranged on the same substrate.

10. The semiconductor device of claim 1, further comprising a terminal structure that surrounds the first and second metal-insulator-semiconductor field-effect transistors.

11. The semiconductor device of claim 1, wherein the semiconductor element further includes a diode which is connected in series to the second metal-insulator-semiconductor field-effect transistor, and
wherein the first metal-insulator-semiconductor field-effect transistor is connected in parallel with the second metal-insulator-semiconductor field-effect transistor and the diode that are connected in series together.

12. A power converter comprising a plurality of legs, each of which includes an upper arm and a lower arm that are each comprised of the semiconductor devices of claim 1.

13. The power converter of claim 12, wherein current flows through a smaller number of first and second metal-insulator-semiconductor field-effect transistors in the reverse direction mode than in the forward direction mode.

14. A method for controlling a semiconductor element including a first metal-insulator-semiconductor field-effect transistor and a second metal-insulator-semiconductor field-effect transistor which is connected in parallel with the first metal-insulator-semiconductor field-effect transistor,
wherein each of the first and second metal-insulator-semiconductor field-effect transistors includes a source electrode, a drain electrode, a gate electrode, and a silicon carbide semiconductor layer which functions as a channel, and
wherein the direction of current flowing from the drain electrode through the silicon carbide semiconductor layer toward the source electrode is defined to be a forward direction and the direction of current flowing from the source electrode through the silicon carbide semiconductor layer toward the drain electrode is defined to be a reverse direction, the method comprising:
controlling the semiconductor element so that in a forward direction mode, current flows in the forward direction through the first and second metal-insulator-semiconductor field-effect transistors but that in a reverse direction mode, current flows in the reverse direction through the first metal-insulator-semiconductor field-effect transistor and the amount of reverse current flowing through the second metal-insulator-semiconductor field-effect transistor becomes smaller than that of reverse current flowing through the first metal-insulator-semiconductor field-effect transistor.

15. A method for controlling the power converter of claim 12, the method comprising:
driving the semiconductor elements of the upper and lower arms so as to alternately turn ON with a dead time, in which the semiconductor elements of the upper and lower arms are both turned OFF, interposed, and either the semiconductor element of the upper arm or the second metal-insulator-semiconductor field-effect transistor of the semiconductor element of the lower arm has its gate voltage set to be a negative voltage during at least a part of the dead time.

* * * * *